(12) United States Patent
Yoo et al.

(10) Patent No.: US 12,198,781 B2
(45) Date of Patent: Jan. 14, 2025

(54) STORAGE DEVICE WITH EYE OPEN MONITORING (EOM) CIRCUIT AND METHOD TO CONTROL

(71) Applicant: SAMSUNG ELECTRONICS CO., LTD., Suwon-si (KR)

(72) Inventors: Hyunjoon Yoo, Suwon-si (KR); Kyoungeun Lee, Hwaseong-si (KR)

(73) Assignee: SAMSUNG ELECTRONICS CO., LTD., Yongin-si (KR)

( * ) Notice: Subject to any disclaimer, the term of this patent is extended or adjusted under 35 U.S.C. 154(b) by 160 days.

(21) Appl. No.: 17/866,765

(22) Filed: Jul. 18, 2022

(65) Prior Publication Data
US 2023/0139392 A1    May 4, 2023

(30) Foreign Application Priority Data

Oct. 29, 2021    (KR) .................. 10-2021-0146668
Dec. 20, 2021    (KR) .................. 10-2021-0182787

(51) Int. Cl.
*G11C 7/20* (2006.01)
*G11C 7/02* (2006.01)
*G11C 7/04* (2006.01)
*G11C 7/10* (2006.01)
*G11C 29/02* (2006.01)

(52) U.S. Cl.
CPC ............ *G11C 7/20* (2013.01); *G11C 7/02* (2013.01); *G11C 7/04* (2013.01); *G11C 7/109* (2013.01); *G11C 29/021* (2013.01)

(58) Field of Classification Search
CPC .... G11C 7/20; G11C 7/02; G11C 7/04; G11C 7/109; G11C 7/1066; G11C 7/1093; G11C 7/222; G11C 29/021; G11C 29/022; G11C 29/50012; G11C 2207/2254; G11C 2029/0409; G11C 2029/0411; G06F 3/0679; G06F 3/0656; G06F 3/0658
See application file for complete search history.

(56) References Cited

U.S. PATENT DOCUMENTS 9,355,708 B2    5/2016  Yu et al.
9,373,365 B2    6/2016  Mozak et al.
9,596,104 B2 *  3/2017  Lyubomirsky .... H04L 25/03057
(Continued)

FOREIGN PATENT DOCUMENTS

KR      10-0907928       7/2009
KR      10-2016-0089922  7/2016

*Primary Examiner* — Sultana Begum
(74) *Attorney, Agent, or Firm* — F. CHAU & ASSOCIATES, LLC

(57) ABSTRACT

A storage device including: a non-volatile memory device including at least one memory die, wherein the at least one memory die includes a plurality of memory regions, each region inputting and outputting a first data signal and a second data signal; and a memory controller including an eye open monitoring (EOM) circuit configured to perform a first EOM operation of generating first EOM information based on the first data signal and a second EOM operation of generating second EOM information based on of the second data signal of at least one of the regions, and configured to compare the second EOM information with the first EOM information, and control the at least one memory die based on a result of the comparison of the first EOM information and the second EOM information.

19 Claims, 19 Drawing Sheets

(56) References Cited

U.S. PATENT DOCUMENTS

| | | |
|---|---|---|
| 9,711,189 B1 | 7/2017 | Wang et al. |
| 10,013,368 B2 | 7/2018 | Berge et al. |
| 10,408,863 B2 | 9/2019 | Jeter et al. |
| 10,853,216 B2 | 12/2020 | Liu et al. |
| 2008/0310574 A1 | 12/2008 | Lee |
| 2010/0014368 A1 | 1/2010 | Schneider et al. |
| 2016/0209462 A1 | 7/2016 | Choi et al. |
| 2019/0220222 A1* | 7/2019 | Ware .................... G06F 3/0679 |
| 2019/0341117 A1 | 11/2019 | Ratnam et al. |
| 2019/0353704 A1 | 11/2019 | Lee et al. |
| 2021/0182166 A1* | 6/2021 | Hahn ................. G06F 11/3034 |

* cited by examiner

STORAGE DEVICE WITH EYE OPEN MONITORING (EOM) CIRCUIT AND METHOD TO CONTROL

CROSS-REFERENCE TO RELATED APPLICATION(S)

This application claims priority under 35 U.S.C. § 119 to Korean Patent Application No. 10-2021-0146668 filed on Oct. 29, 2021 and Korean Patent Application No. 10-2021-0182787 filed on Dec. 20, 2021 in the Korean Intellectual Property Office, the disclosures of which are incorporated by reference herein in their entireties.

TECHNICAL FIELD

The present inventive concept relates to a storage device and a method for controlling the storage device.

DISCUSSION OF RELATED ART

When a storage device performs an operation, an internal temperature of the storage device may increase, and over time, the storage device may deteriorate. As the storage device deteriorates, data input to or output from the storage device may be contaminated, errors may increase, or the like. To alleviate issues associated with deterioration, an eye open monitoring (EOM) circuit, which performs an EOM operation when a memory controller is booted, has been used. For example, based on the number of times a memory die is accessed, a state of a memory die is determined, and operation load is redistributed. However, to measure a temperature of at least one memory die to accurately determine a state of the storage device, there are limitations on the number of temperature sensors that may be employed. In addition, a state of an input/output signal may not be taken into account when redistributing operation loads of memory dies.

SUMMARY

An embodiment of the present inventive concept provides a non-volatile memory device having improved performance. For example, an embodiment of the present inventive concept provides a memory controller including an eye open monitoring (EOM) circuit that determines and compares an initial state of a memory die and a state of the memory die during an operation of the memory die, to accurately determine a deterioration level of the memory die in real time.

According to an embodiment of the present inventive concept, a storage device includes: a non-volatile memory device including at least one memory die, wherein the at least one memory die includes a plurality of memory regions, each region inputting and outputting a first data signal and a second data signal; and a memory controller including an eye open monitoring (EOM) circuit configured to perform a first EOM operation of generating first EOM information based on the first data signal and a second EOM operation of generating second EOM information based on of the second data signal of at least one of the regions, and configured to compare the second EOM information with the first EOM information, and control the at least one memory die based on a result of the comparison of the first EOM information and the second EOM information.

According to an embodiment of the present inventive concept, a storage device includes: a non-volatile memory device including at least one memory die, the at least one memory die includes a memory cell array including a plurality of memory regions, a memory interface circuit for providing signals to control the plurality of memory regions through first control pins, and a control logic circuit for controlling the plurality of memory regions based on the signals; and a memory controller including a controller interface circuit for providing the signals to the first control pins through second control pins, an eye open monitoring (EOM) circuit for accumulating a data signal input to or output from the at least one memory die, among the signals, to perform at least one EOM operation, and an EOM memory storing EOM information acquired by the at least one EOM operation, wherein the memory controller controls the at least one memory die, based on the EOM information stored in the EOM memory.

According to an embodiment of the present inventive concept, a method of controlling a storage device includes: performing a first eye open monitoring (EOM) operation on at least one memory die; storing first EOM information acquired by the first EOM operation in an EOM memory included in a memory controller; performing a second EOM operation by accumulating a signal input to or output from an input/output terminal of the at least one memory die when an operation on the at least one memory die is performed; comparing the first EOM information with second EOM information acquired by the second EOM operation; and determining a state of the at least one memory die, based on a result of the comparison.

BRIEF DESCRIPTION OF THE DRAWINGS

The above and other features of the present inventive concept will be more clearly understood from the following detailed description, taken in conjunction with the accompanying drawings, in which.

DETAILED DESCRIPTION OF THE EMBODIMENTS

Hereinafter, example embodiments of the present inventive concept will be described with reference to the accompanying drawings.

Figure 1:
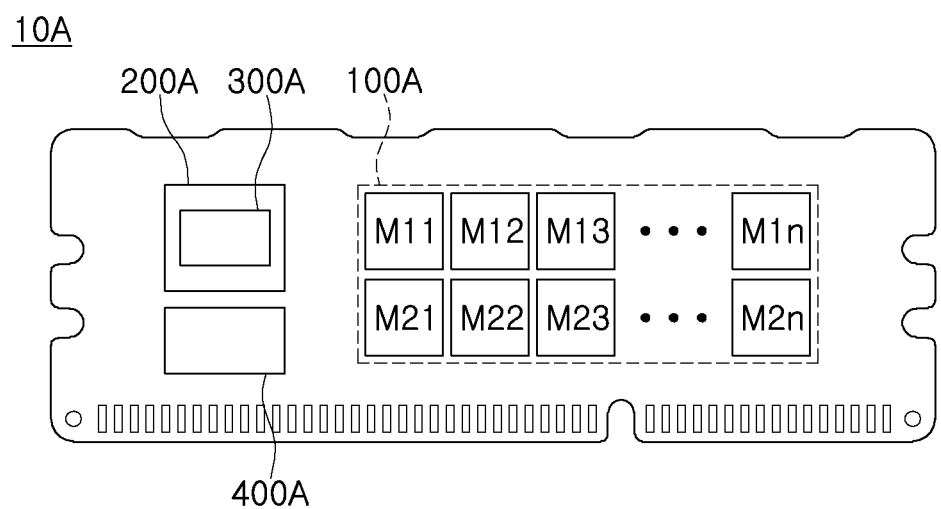
FIG. 1 is a view schematically illustrating a storage device according to an embodiment of the present inventive concept.

FIG. 1 is a view schematically illustrating a storage device according to an embodiment of the present inventive concept. Referring to FIG. 1, a storage device 10A may include a non-volatile memory device 100A, a memory controller 200A, and a buffer memory 400A.

The storage device 10A may include storage media for storing data according to a request from a host, such as a mobile phone, a smartphone, an MP3 player, a laptop computer, a desktop computer, a game machine, a TV, a tablet personal computer (PC), or the like. For example, the storage device 10A may include at least one of a solid state drive (SSD), an embedded memory, or a removable external memory.

Hereinafter, a storage device 10A according to an embodiment of the present inventive concept described in this specification may be an SSD. Therefore, the storage device 10A may be a device conforming to a non-volatile memory express (NVMe) standard. However, the present inventive concept is not limited thereto, and when the storage device 10A is an embedded memory or an external memory, the storage device 10A may be a device conforming to a universal flash storage (UFS) standard or an embedded multi-media card (eMMC) standard. The host and the storage device 10A may generate and transmit a packet according to an adopted standard protocol, respectively.

The storage device 10A may be manufactured in any one of various types of package types. For example, the storage device 10A may be manufactured in any one of various types of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP), or the like.

The non-volatile memory device 100A may be implemented to store data. The non-volatile memory device 100A may be a NAND flash memory, a vertical NAND flash memory (VNAND), a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In addition, the non-volatile memory device 100A may be implemented as a three-dimensional array structure.

A storage device 10A according to an embodiment of the present inventive concept may be applied to a flash memory device in which a charge storage layer is included as a conductive floating gate, as well as a charge trap flash (CTF) in which a charge storage layer is included as an insulating layer. Hereinafter, for convenience of description, it is assumed that the non-volatile memory device 100A is a vertical NAND flash memory device.

The non-volatile memory device 100A may be implemented to include at least one memory die M11, M12, M13, . . . M1n or M21, M22, M23, . . . M2n (where n is an integer equal to or greater than 2). Each of the at least one memory die M11 to M1n or M21 to M2n may include a plurality of memory blocks. Each of the plurality of memory blocks may include a plurality of memory cells. Each of the plurality of memory cells may store at least one bit. For example, the plurality of memory cells may be referred to as a plurality of memory regions to which a data signal corresponding to the at least one bit is input or output.

In a storage device 10A according to an embodiment of the present inventive concept, the memory controller 200A may include an eye open monitoring (EOM) circuit 300A that performs an EOM operation based on a pattern of a data signal input to or output from the non-volatile memory device 100A. However, this is only illustrative and the present inventive concept is not limited thereto. For example, in a storage device 10A according to an embodiment of the present inventive concept, the EOM circuit 300A may also be applied to a buffer memory 400A. For example, the EOM circuit 300A may perform an EOM operation based on a pattern of a data signal input to or output from the buffer memory 400A.

The memory controller 200A may control an overall operation of the storage device 10A, and in particular, may determine a state of the non-volatile memory device 100A based on a result of an EOM operation. For example, the memory controller 200A may redistribute an operation load and/or may control a data signal to be input or output, based on the state of the non-volatile memory device 100A.

In a storage device 10A according to an embodiment of the present inventive concept, the data signal may include a first data signal and a second data signal, having different input/output time points.

When a power voltage is applied to the storage device 10A, the memory controller 200A may be booted to execute firmware for controlling communication between the host and the non-volatile memory device 100A. For example, the first data signal may be an input/output signal when the memory controller 200A is booted. The second data signal may be an input/output signal when an operation on the non-volatile memory device 100A is performed after booting the memory controller 200A.

In a storage device 10A according to an embodiment of the present inventive concept, the EOM circuit 300A may perform a first EOM operation based on a pattern of the first data signal, and may perform a second EOM operation based on a pattern of the second data signal. The memory controller 200A may compare first EOM information generated by the first EOM operation with second EOM information generated by the second EOM operation.

In a storage device 10A according to an embodiment of the present inventive concept, the memory controller 200A may determine a state of the at least one memory die M11 to M1n or M21 to M2n based on a comparison result of the first EOM information and the second EOM information, and may control that memory die. The memory controller 200A may input or output a third data signal, different from the first data signal and the second data signal, to or from the non-volatile memory device 100A, based on the comparison result.

When one memory die among the at least one memory die M11 to M1n or M21 to M2n is deteriorated, the memory controller 200A may perform throttling until the one memory die returns to a normal state, or may replace and allocate an operation load of the one memory die with an operation load of another memory die.

For example, the at least one memory die M11 to M1n or M21 to M2n may include a first memory die and a second memory die. The memory controller 200A may determine a deterioration level of the first memory die and a deterioration level of the second memory die, based on a result of at least one EOM operation.

The memory controller 200A may adjust a first operation load of the first memory die and a second operation load of the second memory die, based on the deterioration level of the first memory die and the deterioration level of the second memory die. For example, when the deterioration level of the first memory die is determined to be greater than the deterioration level of the second memory die, the memory controller 200A may decrease the first operation load and may increase the second operation load. In other words, the operation load of the first memory die may be decreased.

A storage device 10A according to an embodiment of the present inventive concept may include the buffer memory 400A that is used as an operation memory and/or a cache memory of the memory controller 200A. The buffer memory 400A may store codes or commands executed by the memory controller 200A, and may store data processed by the memory controller 200A.

The memory controller 200A may control data exchange between the host and the buffer memory 400A. Alternatively, the memory controller 200A may temporarily store system data for controlling the non-volatile memory device 100A in the buffer memory 400A. For example, the memory controller 200A may temporarily store data input from the host in the buffer memory 400A, and may transmit the data to the non-volatile memory device 100A.

For example, the buffer memory 400A may be implemented as a dynamic random access memory (DRAM) or a static random access memory (SRAM), such as a double data rate synchronous dynamic random access memory (DDR SDRAM), a DDR4 SDRAM, a low power double data rate 4 (LPDDR4) SDRAM, a graphics double data rate (GDDR) SDRAM, a low power DDR (LPDDR), or Rambus dynamic random access memory (RDRAM).

A configuration and a structure of the storage device 10A illustrated in FIG. 1 are merely illustrative and are not limited. For example, the non-volatile memory device 100A may be arranged in various manners, and the buffer memory 400A may be connected to an outside of the storage device 10A.

Figure 2A:
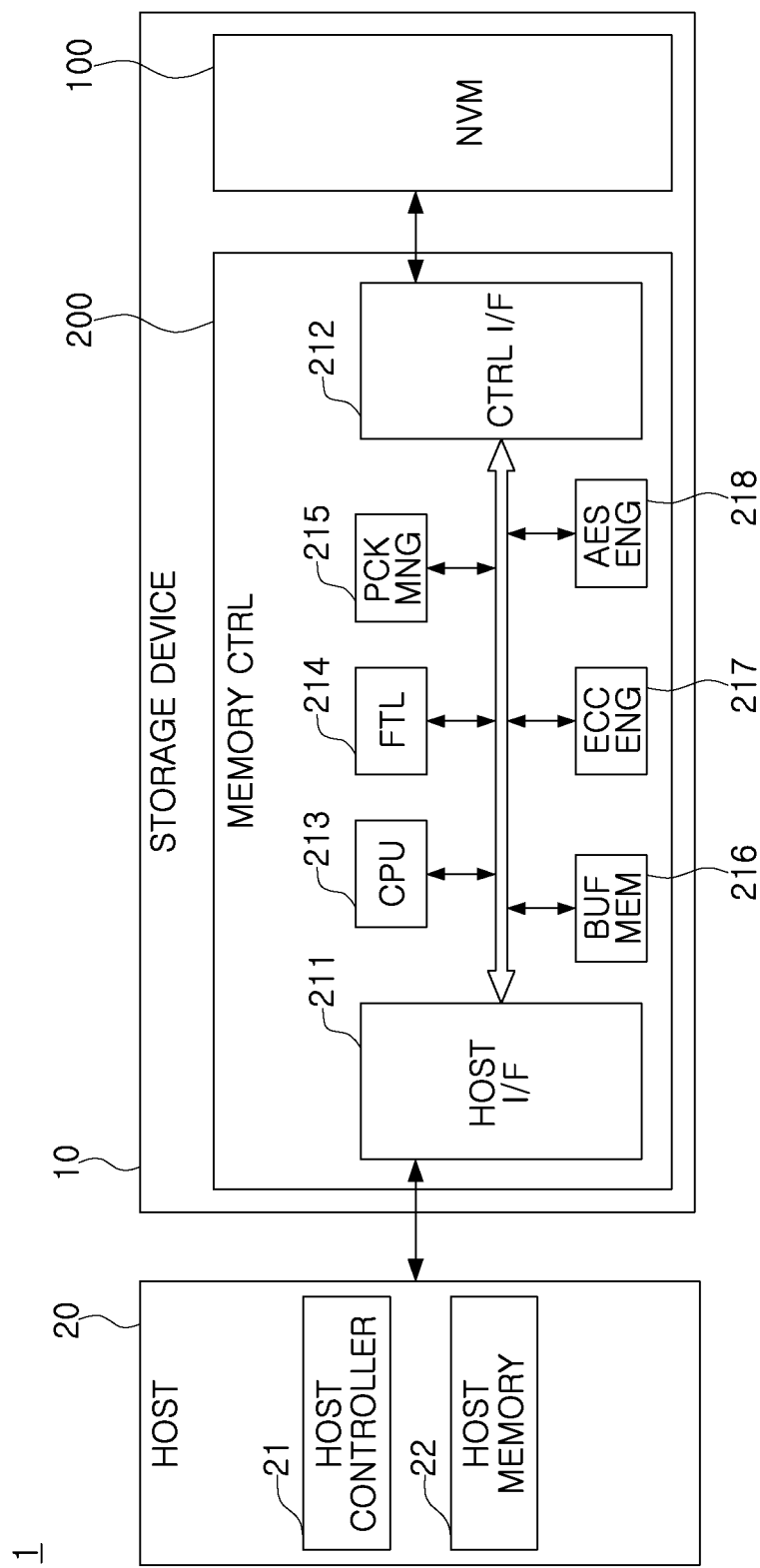
FIGS. 2A and 2B are block diagrams schematically illustrating a system including a storage device according to an embodiment of the present inventive concept.
Figure 2B:
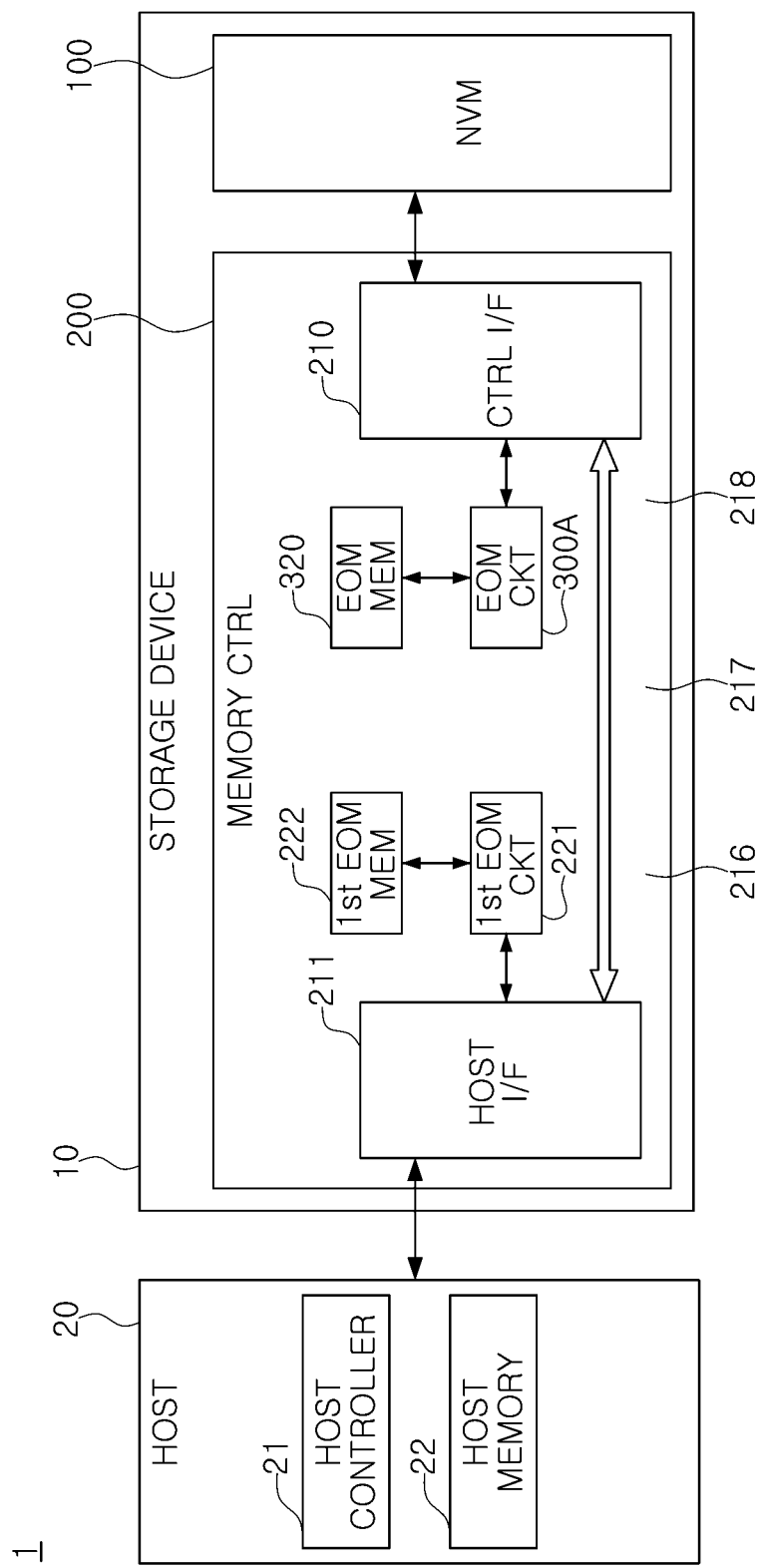

FIGS. 2A and 2B are block diagrams schematically illustrating a system including a storage device according to an embodiment of the present inventive concept.

Referring to FIGS. 2A and 28, a host-storage system 1 may include a host 20 and a storage device 10. In addition, the storage device 10 may include a non-volatile memory device 100 and a memory controller 200.

According to an embodiment of the present inventive concept, the host 20 may include a host controller 21 and a host memory 22. The host memory 22 may function as a buffer memory for temporarily storing data to be transmitted to the storage device 10 or data transmitted from the storage device 10.

For example, the host controller 21 and the host memory 22 may be implemented as separate semiconductor chips. Alternatively, in some embodiments of the present inventive concept, the host controller 21 and the host memory 22 may be integrated on the same semiconductor chip. The host controller 21 may be any one of a plurality of modules included in an application processor, and the application processor may be implemented as a system-on-chip (SOC). In addition, the host memory 22 may be an embedded memory provided in the application processor, or a non-volatile memory or a memory module disposed outside the application processor.

The host controller 21 may manage an operation of storing data (e.g., write data) of a buffer region of the host memory 22 in the ton-volatile memory device 100 or an operation of storing data (e.g., read data) of the non-volatile memory device 100 in the buffer region of the host memory 22.

Referring to FIG. 2A, the memory controller 200 may include a host interface 211, a controller interface 212, and a central processing unit (CPU) 213. In addition, the memory controller 200 may further include a flash translation layer (FTL) 214, a packet manager 215, a buffer memory 216, an error correction code (EEC) 217 engine, and an advanced encryption standard (AES) engine 218. The memory controller 200 may further include a working memory into which the flash translation layer (FTL) 214 is loaded, and may control write and read operations of data for the non-volatile memory device 100 by executing the flash translation layer 214 by the CPU 213.

The host interface 211 may transmit and receive a packet to and from the host 20. A packet transmitted from the host 20 to the host interface 211 may include a command, data to be written to the non-volatile memory device 100, or the like, and a packet transmitted from the host interface 211 to the host 20 may include a response to the command, data to be read from the non-volatile memory device 100, or the like. The controller interface 212 may transmit data to be written to the non-volatile memory device 100 to the non-volatile memory device 100, or may receive data to be read from the non-volatile memory device 100. The controller interface 212 may be implemented to comply with a standard protocol such as a toggle or an open NAND flash interface (ONFI).

The flash translation layer 214 may perform various operations such as address mapping, wear-leveling, and garbage collection. The address mapping operation may be an operation of changing a logical address received from the host 20 into a physical address used to actually store data in the non-volatile memory device 100. The wear-leveling operation may be a technique for preventing excessive deterioration of a specific block by ensuring that blocks in the non-volatile memory device 100 are used uniformly, and may be implemented by, for example, a firmware technique for balancing erase counts of physical blocks. The garbage collection operation may be a technique for securing usable capacity in the non-volatile memory device 100 by copying valid data of a dirty block to an erased block and then erasing the dirty block.

The packet manager 215 may generate a packet according to an interface protocol negotiated with the host 20, or may parse various types of information from a packet received from the host 20. In addition, the buffer memory 216 may temporarily store data to be written to or read from the non-volatile memory device 100. The buffer memory 216 may be provided in the memory controller 200, but may be disposed outside the memory controller 200. For example, the buffer memory 216 may have a configuration corresponding to the buffer memory 400A illustrated in FIG. 1. However, this is merely illustrative and the present inventive concept is not limited thereto.

The ECC engine 217 may perform an error detection and correction function on read data read from the non-volatile memory device 100. For example, the ECC engine 217 may generate parity bits for write data to be written into the non-volatile memory device 100, and the generated parity bits may be stored in the non-volatile memory device 100, together with the write data. When reading data from the non-volatile memory device 100, the ECC engine 217 may correct an error in read data using parity bits read from the non-volatile memory device 100, together with the read data, and the error-corrected read data may be output.

The AES engine 218 may perform at least one of an encryption operation or a decryption operation on data input to the memory controller 200 using a symmetric-key algorithm.

Referring to FIG. 2B, a storage device 10 according to an embodiment of the present inventive concept may apply an EOM circuit 300A to a controller interface 210 of the memory controller 200. Therefore, an existing circuit may be used, without adding and/or changing a circuit, to determine a state of the non-volatile memory device 100 in real time. For example, EOM information acquired by the EOM circuit 300A may be stored in an EOM memory 320. The EOM information stored in the EOM memory 320 may be used to determine the state of the non-volatile memory device 100.

A storage device 10 according to an embodiment of the present inventive concept may include a first EOM circuit 221 applied to a host interface 211 of the memory controller 200, and a first EOM memory 222 storing data acquired by the first EOM circuit 221. The EOM circuit 300A applied to the controller interface 210 may be distinguished from the first EOM circuit 221 applied to the host interface 211. The first EOM circuit 221 may perform an operation to compensate for distortion of a signal applied from the host 20 transmitting or receiving a packet to or from the memory controller 200.

As described above, a storage device 10 according to an embodiment of the present inventive concept may determine a state of a buffer memory using the EOM circuit 300A. However, this is merely illustrative and the present inventive concept is not limited thereto. For example, the storage device 10 may further include a second EOM circuit, different from the EOM circuit 300A for determining the state of the buffer memory, and the first EOM circuit 221.

Figure 3A:
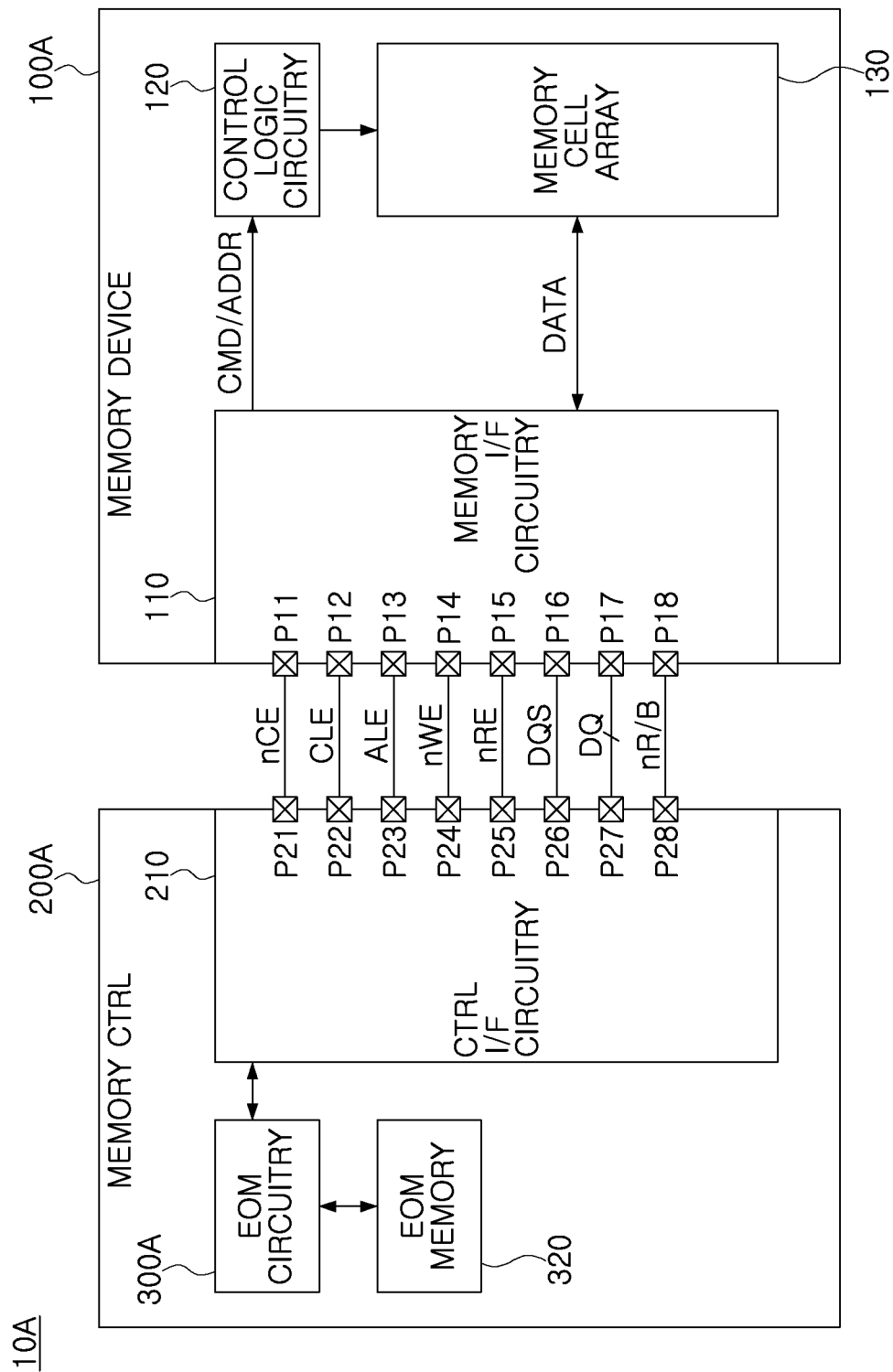
FIG. 3A is a block diagram schematically illustrating a storage device according to an embodiment of the present inventive concept.

FIG. 3A is a block diagram schematically illustrating a storage device according to an embodiment of the present inventive concept.

Referring to FIG. 3A, a storage device 10A may include a non-volatile memory device 100A and a memory controller 200A. The non-volatile memory device 100A may correspond to the non-volatile memory device 100 of FIGS. 2A and 2B, and the memory controller 200A may correspond to the memory controller 200 of FIGS. 2A and 2B.

The non-volatile memory device 100A may include at least one memory die. The at least one memory die may include first control pins including first, second, third, fourth, fifth, sixth, seventh and eighth pins P11, P12, P13, P14, P15, P16, P17 and P18, a memory interface circuit 110, a control logic circuit 120, and a memory cell array 130.

The memory interface circuit 110 may receive a chip enable signal from the memory controller 200A through the first pin P11. The memory interface circuit 110 may transmit and receive signals to and from the memory controller 10 through the second to eighth pins P12 to P18 according to the chip enable signal nCE. For example, when the chip enable signal nCE may be in an enable state (e.g., a low level), the memory interface circuit 110 may transmit and receive signals to and from the memory controller 200A through the second to eighth pins P12 to P18.

The memory interface circuit 110 may receive a command latch enable signal CLE, an address latch enable signal ALE, and a write enable signal nWE from the memory controller 200A through the second to fourth pins P12 to P14. The memory interface circuit 110 may receive a data signal DQ from the memory controller 200A through the seventh pin P17 or transmit the data signal DQ to the memory controller 200A. A command CMD, an address ADDR, and data DATA may be transmitted via the data signal DQ. For example, the data signal DQ may be transmitted through a plurality of data signal lines. In this case, the seventh pin P17 may include a plurality of pins respectively corresponding to a plurality of data signals DQ.

The memory interface circuit 110 may obtain the command CMD from the data signal DQ, received in an enable section (e.g., a high-level state) of the command latch enable signal CLE, based on toggle time points of the write enable signal nWE. The memory interface circuit 110 may obtain the address ADDR from the data signal DQ, received in an enable section (e.g., a high-level state) of the address latch enable signal ALE, based on the toggle time points of the write enable signal nWE.

For example, the write enable signal nWE may be maintained at a static state (e.g., a high level or a low level), and may toggle between the high level and the low level. For example, the write enable signal nWE may toggle in a section in which the command CMD or the address ADDR is transmitted. Thus, the memory interface circuit 110 may obtain the command CMD or the address ADDR based on toggle time points of the write enable signal nWE.

The memory interface circuit 110 may receive a read enable signal nRE from the memory controller 200A through the fifth pin P15. The memory interface circuit 110 may receive a data strobe signal DQS from the memory controller 200A through the sixth pin P16 or transmit the data strobe signal DQS to the memory controller 200A.

In a data (DATA) output operation of the non-volatile memory device 100A, the memory interface circuit 110 may receive the read enable signal nRE, toggling through the fifth pin P15, before outputting the data DATA. The memory interface circuit 110 may generate the data strobe signal DQS, toggling based on the toggling of the read enable signal nRE. For example, the memory interface circuit 110 may generate a data strobe signal DQS, which starts toggling after a predetermined delay, based on a toggling start time of the read enable signal nRE. The memory interface circuit 110 may transmit the data signal DQ including the data DATA based on a toggle time point of the data strobe signal DQS. Thus, the data DATA may be aligned with the toggle time point of the data strobe signal DQS and transmitted to the memory controller 200A.

In a data (DATA) input operation of the non-volatile memory device 100A, when the data signal DQ including the data DATA is received from the memory controller 200A, the memory interface circuit 110 may receive the data strobe signal DQS, toggling, along with the data DATA from the memory controller 200A. The memory interface circuit 110 may obtain the data DATA from the data signal DQ based on toggle time points of the data strobe signal DQS. For example, the memory interface circuit 110 may sample the data signal DQ at rising and falling edges of the data strobe signal DQS and obtain the data DATA.

The memory interface circuit 110 may transmit a ready/busy output signal nR/B to the memory controller 200A through the eighth pin P18. The memory interface circuit 110 may transmit state information of the non-volatile memory device 100A through the ready/busy output signal nR/B to the memory controller 200A. When operations are being performed in the non-volatile memory device 100A, the memory interface circuit 110 may transmit a ready/busy output signal nR/B indicating the busy state to the memory controller 200A. When operations are not performed or completed in the non-volatile memory device 100A, the memory interface circuit 110 may transmit a ready/busy output signal nR/B indicating the ready state to the memory controller 200A.

The control logic circuit 120 may control all operations of the non-volatile memory device 100A. The control logic circuit 120 may receive the command/address CMD/ADDR acquired from the memory interface circuit 110. The control logic circuit 120 may generate control signals for controlling other components of the non-volatile memory device 100A in response to the received command address CMD/ADDR. For example, the control logic circuit 120 may generate various control signals for programming data DATA to the memory cell array 130 or reading the data DATA from the memory cell array 130.

The memory cell array 130 may store the data DATA acquired from the memory interface circuit 110, under control of the control logic circuit 120. The memory cell array 130 may output the stored data DATA to the memory interface circuit 110 under control of the control logic circuit 120. The memory cell array 130 may include a plurality of memory cells. For example, the plurality of memory cells may be flash memory cells.

The memory controller 200A may include second control pins including first, second, third, fourth, fifth, sixth, seventh and eighth pins P21, P22, P23, P24, P25, P26, P27 and P28, a controller interface circuit 210, an EOM circuit 300A, and an EOM memory 320. The first to eighth pins P21 to P28 may correspond to the first to eighth pins P11 to P18 of the non-volatile memory device 100A.

The controller interface circuit 210 may transmit the chip enable signal nCE to the non-volatile memory device 100A through the first pin P21. The controller interface circuit 210 may transmit and receive signals to and from the non-volatile memory device 100A, selected by the chip enable signal nCE, through the second to eighth pins P22 to P28.

The controller interface circuit 210 may transmit the command latch enable signal CLE, the address latch enable signal ALE, and the write enable signal nWE to the non-volatile memory device 100A through the second to fourth pins P22 to P24. The controller interface circuit 210 may transmit or receive the data signal DQ to and from the non-volatile memory device 100A through the seventh pin P27.

The controller interface circuit 210 may transmit the data signal DQ including the command CMD or the address ADDR to the non-volatile memory device 100A along with the write enable signal nWE, toggling. The controller interface circuit 210 may transmit the data signal DQ including the command CMD to the non-volatile memory device 100A by transmitting a command latch enable signal CLE having an enable state, and may transmit the data signal DQ including the address ADDR to the non-volatile memory device 100A by transmitting an address latch enable signal ALE having an enable state.

The controller interface circuit 210 may transmit the read enable signal nRE to the non-volatile memory device 100A through the fifth pin P25. The controller interface circuit 210 may receive or transmit the data strobe signal DQS from or to the non-volatile memory device 100A through the sixth pin P26.

In a data (DATA) output operation of the non-volatile memory device 100A, the controller interface circuit 210 may generate a read enable signal nRE, toggling, and transmit the read enable signal nRE to the non-volatile memory device 100A. For example, before outputting data DATA, the controller interface circuit 210 may generate a read enable signal nRE, changed from a static state (e.g., a high level or a low level) to a toggling state. Thus, the non-volatile memory device 100A may generate a data strobe signal DQS, toggling, based on the read enable signal nRE. The controller interface circuit 210 may receive the data signal DQ including the data DATA along with the data strobe signal DQS, toggling, from the non-volatile memory device 100A. The controller interface circuit 210 may obtain the data DATA from the data signal DQ based on a toggle time point of the data strobe signal DQS.

In a data (DATA) input operation of the non-volatile memory device 100A, the controller interface circuit 210 may generate a data strobe signal DQS, toggling. For example, before transmitting data DATA, the controller interface circuit 210 may generate a data strobe signal DQS, changed from a static state (e.g., a high level or a low level) to a toggling state. The controller interface circuit 210 may transmit the data signal DQ including the data DATA to the non-volatile memory device 100A based on toggle time points of the data strobe signal DQS. In addition, the controller interface circuit 210 may transmit a data strobe signal DQS and other signals that may be used to acquire EOM information for determining a state of the memory die during an operation in real time, along with the data signal DQ, to the non-volatile memory device 100A.

The controller interface circuit 210 may receive a ready/busy output signal nR/B from the non-volatile memory device 100A through the eighth pin P28. The controller interface circuit 210 may determine state information of the non-volatile memory device 100A based on the ready busy output signal nR/B.

A memory controller 200A of a storage device 10A according to an embodiment of the present inventive concept may include an eye open monitoring (EOM) circuit 300A that performs at least one EOM operation. For example, the EOM circuit 300A may acquire EOM information by accumulating a data signal DQ input to or output from the at least one memory the among signals transmitted or received between the first control pins and the second control pins. In other words, the EOM circuit 300A may acquire EOM information from the data signal DQ transmitted between the memory interface circuit 110 and the controller interface circuit 210. However, this is merely illustrative and the present inventive concept is not limited thereto. For example, the EOM information may be acquired from an accumulated data strobe signal DQS and other signals input to or output from the memory die.

The EOM circuit 300A may acquire first EOM information by performing a first EOM operation when the memory controller 200A is booted. The EOM circuit 300A may acquire second EOM information by performing a second EOM operation when performing an operation on the at least one memory die after the first EOM operation is completed. However, this is merely illustrative and the present inventive concept is not limited thereto. For example, the memory controller 200A according to an embodiment of the present inventive concept may acquire the second EOM information, and may then perform data training, to additionally acquire EOM information after the second EOM operation.

The acquired EOM information may be stored in the EOM memory 320. The memory controller 200A may perform data training based on the EOM information stored in the EOM memory 320. In addition, the memory controller 200A may determine a state of the memory die based on the EOM information. For example, the memory controller 200A may improve reliability of EOM information by aligning the data signal DQ and the data strobe signal DQS, and may control the at least one memory die included in the non-volatile memory device 100A, according to the state of the memory die determined based on the EOM information.

A storage device 10A according to an embodiment of the present inventive concept may utilize the EOM circuit 300A used only when the memory controller 200A is booted during an operation. The storage device 10A may compare the first EOM information acquired during booting of the memory controller 200A with the second EOM information acquired during the operation, to determine a deterioration level of the at least one memory die included in the non-volatile memory device 100A.

The storage device 10A may perform throttling on a corresponding memory die, based on the determined deterioration level of the at least one memory die, or may replace and allocate an operation load of the corresponding memory die with an operation load of another memory die.

For example, when a deterioration level of a corresponding memory die is a correctable level, throttling may be performed on the corresponding memory die, and an operation may be performed again by performing deterioration correction on the corresponding memory die. In this case, the throttling of the memory die may be performed for a predetermined time period and/or until the memory die may operate normally. In other words, the same memory die may continue to be used. When a deterioration level of a corresponding memory die is an uncorrectable level, an operation load of the corresponding memory die may be performed on another memory die. In other words, the memory die with the uncorrectable level may not be used.

A memory controller 200A included in a storage device 10A according to an embodiment of the present inventive concept may suspend an operation of the memory die having a severe deterioration level for a predetermined time period, or may perform to adjust an operating voltage and/or a frequency.

In a memory die determined to have a severe deterioration level, an additional EOM operation may be performed to acquire EOM information again after a predetermined time period has elapsed. When it is determined that a corresponding memory die is restored to a normal state, based on the re-acquired EOM information, the corresponding memory die may be controlled to operate on the same basis as a normal memory die. However, this is merely illustrative and the present inventive concept is not limited thereto. For example, a memory die determined to have a severe deterioration level may be controlled to operate on the same basis as a normal memory die after a predetermined time period elapses, without an additional EOM operation being performed.

In this case, whether the corresponding memory, die is restored to a normal state may be determined by comparing at least one parameter, among parameters included in the re-acquired EOM information, with a parameter included in the initial EOM information. For example, when the at least one parameter included in the re-acquired EOM information is at a level of about 90% to 100% of the parameter included in the initial EOM information or is higher than the parameter included in the initial EOM information, it may be determined that the memory die is restored to a normal state. In other words, when the at least one parameter included in the re-acquired EOM information satisfies a predetermined threshold criteria, it may be determined that the memory die is restored to a normal state. However, the criteria for determining whether the memory die is restored to the normal state are not limited to the above range, and whether the memory die is in the normal state may be determined under other criteria, as necessary.

A storage device 10A according to an embodiment of the present inventive concept may check a state of the non-volatile memory device 100A for each memory die in real time while minimizing an additional configuration.

However, a configuration of the storage device 10A of the present inventive concept is not limited to that illustrated in FIG. 3A. For example, the storage device 10A may further include a plurality of pins for transmitting and receiving additional signals. In addition, the memory controller 200A may further include a host interface circuit that receives an external signal from the host and corresponds to the host interface 211 of FIG. 2A. The storage device 10A of FIG. 3A may include the EOM circuit 300A and the controller interface circuit 210 as separate components, but the present inventive concept is not limited thereto.

Figure 3B:
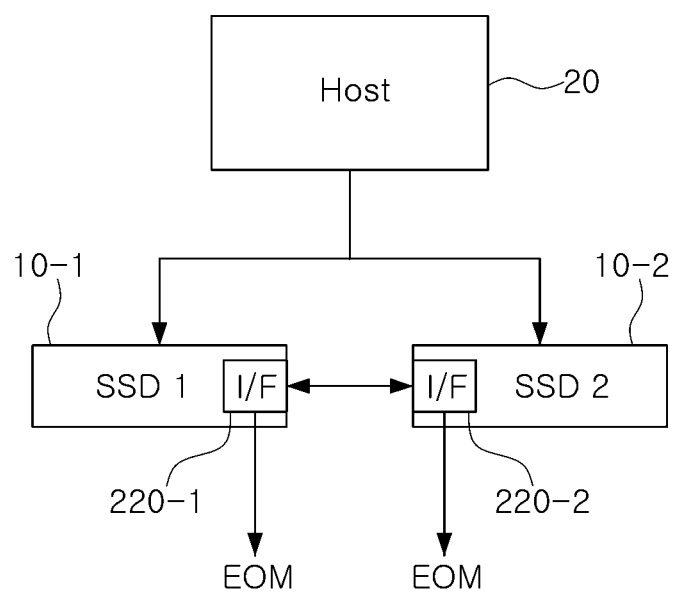
FIG. 3B is a block diagram schematically illustrating a storage device according to another embodiment of the present inventive concept.

FIG. 3B is a block diagram schematically illustrating a storage device according to another embodiment of the present inventive concept.

Referring to FIG. 3B, a first storage device 10-1 according to an embodiment of the present inventive concept may communicate with a second storage device 10-2 regardless of a host 20. For example, the first storage device 10-1 may be connected to the second storage device 10-2 to exchange data with each other. In other words, the first storage device 10-1 and the second storage device 10-2 may directly communicate with each other. However, this is merely illustrative and the present inventive concept is not limited thereto. The first storage device 10-1 and the second storage device 10-2 may exchange data with each other through the host 20.

A path through which the first storage device 10-1 and the second storage device 10-2 exchange data may vary depending on states of interfaces 220-1 and 220-2 connecting the first storage device 10-1 and the second storage device 10-2. In this case, a feature of the present inventive concept that may determine a state of each of the first and second storage devices 10-1 and 10-2 using EOM information may be applied to the interfaces 220-1 and 220-2 connecting that the first storage device 10-1 and the second storage device 10-2.

For example, a first interface 220-1 included in the first storage device 10-1 and a second interface 220-2 included in the second storage device 10-2 may respectively include EOM circuits for acquiring EOM information based on data transferred between the first and second storage devices 10-1 and 10-2 and checking states of the first and second interfaces 220-1 and 220-2.

Therefore, a first storage device 10-1 and a second storage device 10-2 according to an embodiment of the present inventive concept may acquire EOM information according to communication between each other, to check states of the first and second interfaces 220-1 and 220-2. The first storage device 10-1 and the second storage device 10-2 may determine whether to directly exchange data with each other or to send and receive data through the host 20, based on the acquired EOM information.

Figure 4:
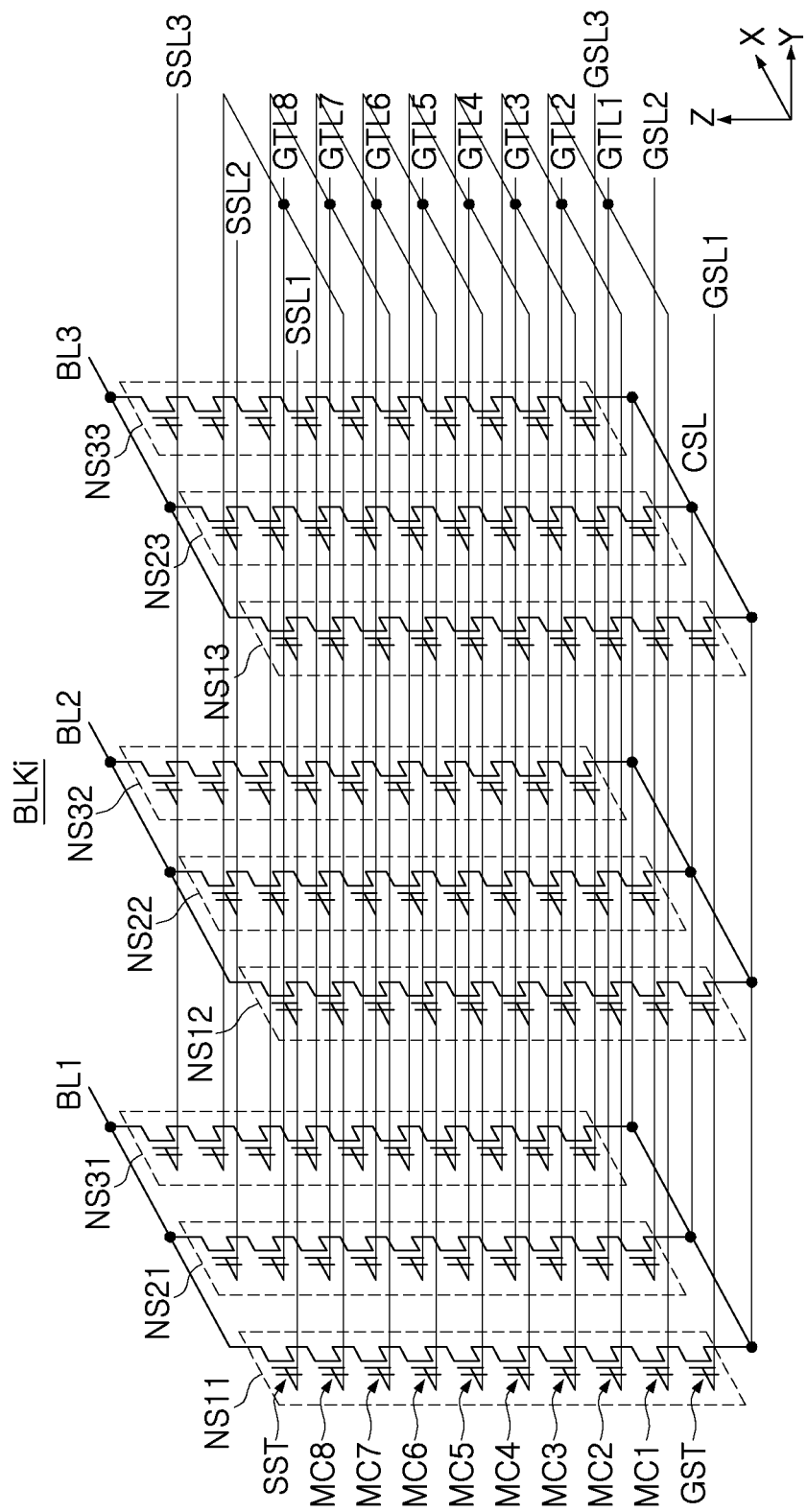
FIG. 4 is a view illustrating a three-dimensional (3D) V-NAND structure applicable to a storage device according to an embodiment of the present inventive concept.

FIG. 4 is a view illustrating a 3D V-NAND structure applicable to a storage device according to an embodiment of the present inventive concept.

Referring to FIG. 4, when a non-volatile memory device of a storage device may be implemented as a 3D V-NAND type flash memory, a plurality of memory regions constituting at least one memory die included in the non-volatile memory device may be respectively represented by an equivalent circuit of a memory block as illustrated in FIG. 4.

A memory block BLKi illustrated in FIG. 4 may represent a three-dimensional memory block formed on a substrate in a three-dimensional structure. For example, a plurality of memory NAND strings included in the memory block BLKi may be formed in a direction, perpendicular to the substrate.

Referring to FIG. 4, the memory block BLKi may include a plurality of memory NAND strings NS11, NS12, NS13, NS21, NS22, NS23, NS31, NS32 and NS33 connected between bit lines BL1, BL2, and BL3 and a common source line CSL. Each of the plurality of memory NAND strings NS11 to NS33 may include a string select transistor SST, a plurality of memory cells MC1, MC2, MC3, MC4, MC5, MC6, MC7, and MC8, and a ground select transistor GST. Although it is illustrated in FIG. 4 that each of the plurality of memory NAND strings NS11 to NS33 includes eight memory cells MC1, MC2, . . . , MC8, the present inventive concept the present inventive concept is not limited thereto.

The string select transistor SST may be connected to string select lines SSL1, SSL2, and SSL3 corresponding thereto. The plurality of memory cells MC1, MC2, . . . , MC8 may be respectively connected to gate lines GTL1, GTL2, GTL3, GTL4, GTL5, GTL6, GTL7, and GTL8 corresponding thereto. The gate lines GTL1, GTL2, . . . , GTL8 may correspond to word lines, and a portion of the gate lines GTL1, GTL2, . . . , GTL8 may correspond to dummy word lines. The ground select transistor GST may be connected to ground select lines GSL1, GSL2, and GSL3 corresponding thereto. The string select transistor SST may be connected to the bit lines BL1, BL2, and BL3 corresponding thereto, and the ground select transistor GST may be connected to the common source line CSL.

Word lines having the same height (e.g., WL1) may be commonly connected, and the ground selection lines GSL1, GSL2, and GSL3 and the string select lines SSL1, SSL2, and SSL3 may be separated from each other. In FIG. 4, the memory block BLKi is illustrated as being connected to eight gate lines GTL1, GTL2, . . . , GTL8 and three bit lines BL1, BL2, BL3, but the present inventive concept is not limited thereto.

Figure 5:
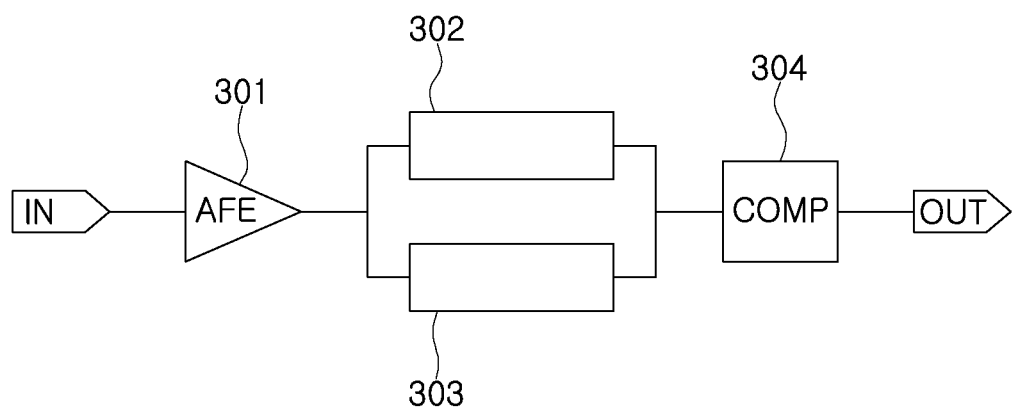
FIG. 5 is a view schematically illustrating an eye open monitoring (EOM) circuit included in a storage device according to an embodiment of the present inventive concept.

FIG. 5 is a view schematically illustrating an EOM circuit included in a storage device according to an embodiment of the present inventive concept.

Referring to FIG. 5, an EOM circuit included in a storage device according to an embodiment of the present inventive concept may include an analog front end (AFE) 301, a first circuit 302 and a second circuit 303, connected in parallel to each other, and a comparator (COMP) 304 receiving outputs of the first circuit 302 and the second circuit 303 as inputs. The EOM circuit of FIG. 5 is merely illustrative, and a structure of the EOM circuit the present inventive concept is not limited to that illustrated in FIG. 5. For example, the EOM circuit may be implemented as a sampler, an equalizer, a clock and data recovery circuit, a phase locked loop, a decoder, or the like.

The EOM circuit may measure an eye diagram based on signals input to or output from at least one memory die. For example, the EOM circuit may compare complementary input voltages with target reference voltages corresponding to complementary reference voltages. The input voltages may be voltages at a predetermined point of the at least one memory die at which the eye diagram is desired to be measured.

The AFE 301 may receive an analog data signal, and may convert the analog data signal into a digital signal that may be processed by the EOM circuit. One of the first circuit 302 and the second circuit 303 may delay an output signal of the AFE 301 in units of time. For example, the second circuit 303 may delay the output signal of the AFE 301.

The comparator 304 may receive input voltages from the first circuit 302, and may receive target reference voltages from the second circuit 303. The comparator 304 may compare the input voltages with delayed target reference voltages. The comparator 304 may count result values of sampling output values for a predetermined time period, and output the result values.

Therefore, the EOM circuit may measure the eye diagram based on the data signal input to or output from the at least one memory die. The measured eye diagram may include EOM information used to control a corresponding memory die.

Figure 6:
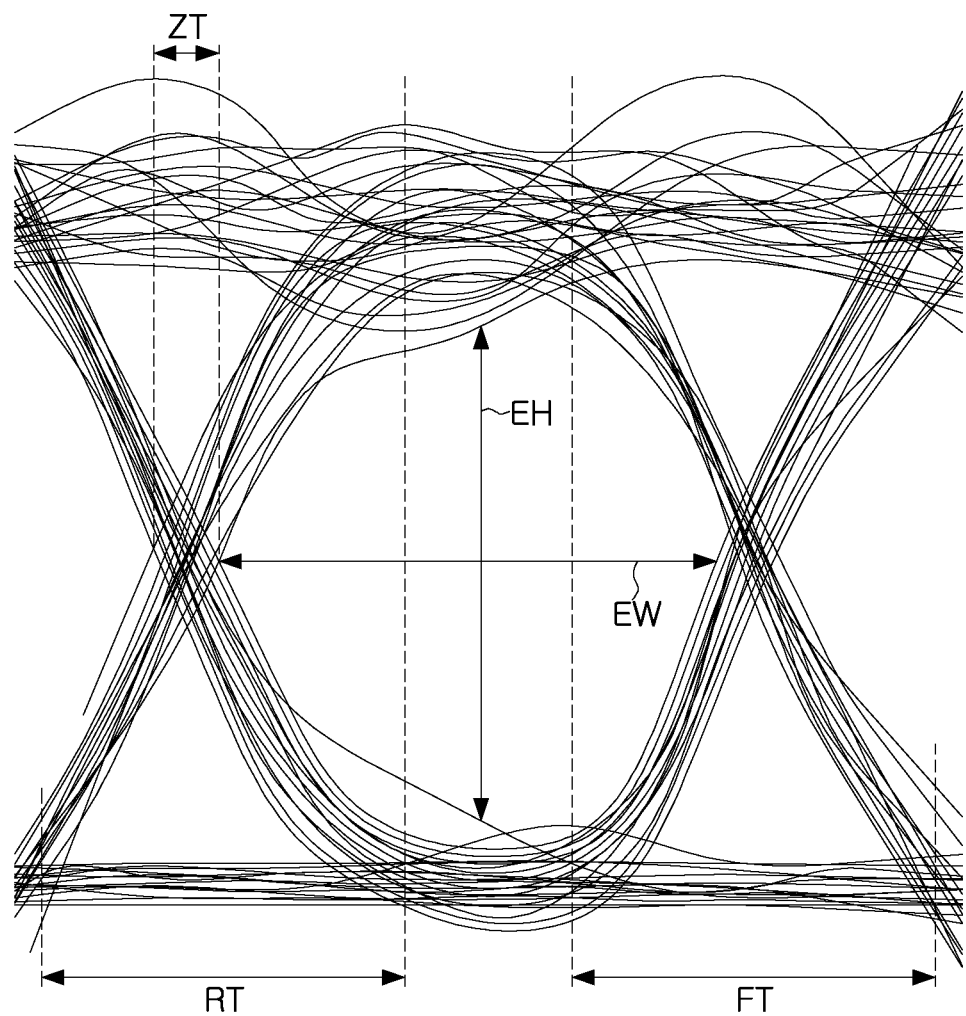
FIG. 6 is a view schematically illustrating an eye diagram formed by accumulating data signals in a storage device according to an embodiment of the present inventive concept.

FIG. 6 is a view schematically illustrating an eye diagram formed by accumulating data signals in a storage device according to an embodiment of the present inventive concept.

Referring to FIG. 6, an eye diagram may be an accumulation of signals such that a high value and a low value cross each other in one data signal. EOM information may be information related to a characteristic of an eye included in an eye diagram acquired by an EOM operation.

For example, the EOM information may include rising time (RT) or falling time (FT) of an eye, jitter (ZT), an eye height (EH), or an eye width (EW).

The EOM information may vary according to Process, Voltage, Temperature (PVT) conditions. However, this is merely illustrative and the present inventive concept is not limited thereto. For example, the EOM information may vary according to an operation load of a memory die during an operation. A storage device according to an embodiment of the present inventive concept may determine states of input/output signals based on the EOM information acquired from the EOM operation, and may correct a deterioration level of the memory die to which the signals are input/output. For example, the signals used to correct the deterioration level of the memory die may include a data signal, but the present inventive concept is not limited thereto.

When there is sufficient information about the PVT condition, a state of the memory die may be determined by inferring EOM information therefrom. A storage device according to an embodiment of the present inventive concept may more accurately determine the deterioration level of the memory die by additionally using temperature information and/or voltage information.

In a control method of a storage device according to an embodiment of the present inventive concept, a state of a memory die inside the storage device, in particular a temperature characteristic, may be determined using features of the eye diagram, and an operation load may be redistributed by the other memory die having relatively sufficient operation. Therefore, an erroneous operation and data contamination that may occur in a deteriorated memory die that may not be in an intact state may be prevented.

Figure 7:
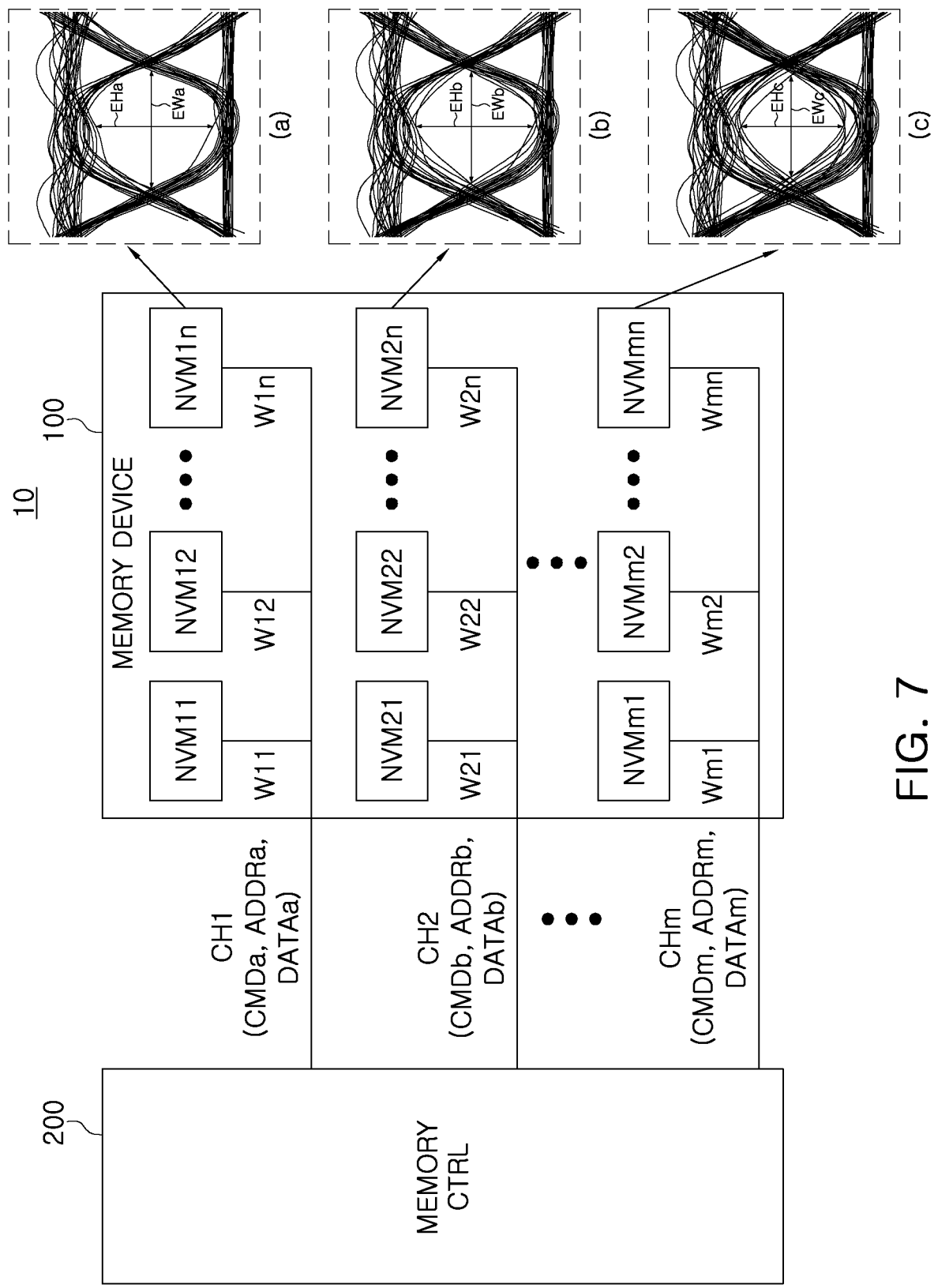
FIG. 7 is a view illustrating a difference in an eye diagram according to a temperature in a storage device according to an embodiment of the present inventive concept.

FIG. 7 is a view illustrating a difference in an eye diagram according to a temperature in a storage device according to an embodiment of the present inventive concept.

Referring to FIG. 7, a storage device 10 may include a non-volatile memory device 100 and a memory controller 200. The storage device 10 may support a plurality of channels CH1 to CHm, and the non-volatile memory device 100 and the memory controller 200 may be connected through the plurality of channels CH1 to CHm. For example, the storage device 10 may be implemented as a solid state drive (SSD).

The non-volatile memory device 100 may include at least one memory die NVM11 to NVMmn. The at least one memory die NVM11 to NVMmn may be connected to one of the plurality of channels CH1 to CHm through a way corresponding thereto. For example, the at least one memory die NVM11 to NVM1n may be connected to a first channel CH1 through ways W11 to W1n, and at least one memory die NVM21 to NVM2n may be connected to a second channel CH2 through ways W21 to W2n. In addition, at least one memory die NVMm1 to NVMmn may be connected to an m-th channel CHm through ways Wm1 to Wmn.

In an embodiment of the present inventive concept, the at least one memory die NVM11 to NVMmn may be operated according to an individual command from the memory controller 200, but the present inventive concept is not limited thereto thereto.

The memory controller 200 may transmit and receive signals to and from the non-volatile memory device 100 through the plurality of channels CH1 to CHm. For example, the memory controller 200 may transmit commands CMDa to CMDm, addresses ADDRa to ADDRm, and data DATAa to DATAm to the non-volatile memory device 100 through the channels CH1 to CHm, or may receive the data DATAa to DATAm from the non-volatile memory device 100 through the channels CH1 to CHm.

The memory controller 200 may select one of the memory, die NVM11 to NVMmn connected to a corresponding channel through each of the channels CH1 to CHm, and may transmit and receive signals to and from the selected memory die. For example, the memory controller 200 may select a first memory die NVM11 connected to a first channel CH1, among the memory die NVM11 to NVMmn. The memory controller 200 may transmit a command CMDa, an address ADDRa, and data DATAa to the first memory die NVM11 through the first channel CH1, or may receive the data DATAa from the selected first memory die NVM11.

The memory controller 200 may transmit and receive signals to and from the non-volatile memory device 100 through different channels in parallel. For example, the memory controller 200 may transmit a command CMDb to the non-volatile memory device 100 through a second channel CH2 while transmitting the command CMDa to the non-volatile memory device 100 through the first channel CH1. For example, the memory controller 200 may receive data DATAb from the non-volatile memory device 100 through the second channel CH2 while receiving the data DATAa from the non-volatile memory device 100 through the first channel CH1.

The memory controller 200 may control an overall operation of the non-volatile memory device 100. The memory controller 200 may transmit signals to the channels CH1 to CHm, to control each of the at least one memory die NVM11 to NVMmn connected to the channels CH1 to CHm. For example, the memory controller 200 may transmit the command CMDa and the address ADDRa through the first channel CH1, to control a selected one of the at least one memory die NVM11 to NVMmn.

Each of the at least one memory die NVM11 to NVMmn may operate under control of the memory controller 200. For example, the first memory die NVM11 may program the data DATAa according to the command CMDa and the address ADDRa, provided through the first channel CH1. For example, the second memory die NVM21 may read the data DATAb according to the command CMDb and the address ADDRb, provided through the second Channel CH2, and may transmit the read data DATAb to the memory controller 200.

FIG. 7 illustrates that the non-volatile memory device 100 communicates with the memory controller 200 through m channels, and the non-volatile memory device 100 may include n non-volatile memory devices corresponding to each of the channels. However, the number of channels and the number of memory die connected to one channel among the channels may be variously changed.

In FIG. 7, (a) may be an eye diagram measured in a memory die NVM1n having a low temperature state, for example, a temperature of about −25° C. In FIG. 7, (b) may be an eye diagram measured in a memory die NVM2n having a room temperature state, for example, a temperature of about 25° C. In FIG. 7, (c) may be an eye diagram measured in a memory die NVMmn having a high temperature state, for example, a temperature of about 85° C. However, the eye diagrams of (a) to (c) in FIG. 7 are merely illustrative. For example, an eye diagram of a memory die the present inventive concept is not limited to those illustrated.

As described above, the eye diagrams may appear differently depending on a temperature of each of the memory dies NVM11 to NVMmn. For example, as temperatures of the memory dies NVM11 to NVMmn increase, sizes of eyes may decrease. For example, an eye width EWa and an eye height EHa in the eye diagram of (a) measured at a low temperature state may be greater than an eye width EWb and an eye height EHb in the eye diagram of (b) measured at room temperature. In addition, an eye width EWc and an eye height EHc in the eye diagram of (c) measured at a high temperature state may be less than the eye width EWb and the eye height EWb in the eye diagram of (b) measured at room temperature. The eye width EWc and the eye height EHc in the eye diagram of (c) measured at a high temperature state may be even less than the eye width EWa and the eye height EHa in the eye diagram of (a) measured at a low temperature state.

However, this is merely illustrative and the present inventive concept is not limited thereto. For example, a relationship between the temperature of each of the memory dies NVM11 to NVMmn and the eye diagram may vary depending on process and design factors of the memory dies NVM11 to NVmn. For example, the eye width EWa in the eye diagram of (a) measured in a low temperature state may be greater than the eye width EWb in the eye diagram of (b) measured in a room temperature state, and the eye height EHa of in the eye diagram of (a) may be less than the eye height EHb in the eye diagram of (b).

In addition, the eye diagrams of memory dies NVM11 to NVMmn may be measured to have different tendencies. Further, in general, the memory dies NVM11 to NVMmn are assumed to operate best at room temperature close to a temperature at which the memory controller 200 is booted. Therefore, states of the memory dies NVM11 to NVMmn when the memory controller 200 is booted may be a criterion for determining states of the memory dies NVM11 to NVMmn during an operation. In other words, the boot-up state of the memory dies NVM11 to NVMmn may serve as a baseline for comparison with the operating states of the memory dies NVM11 to NVMmn.

Figure 8:
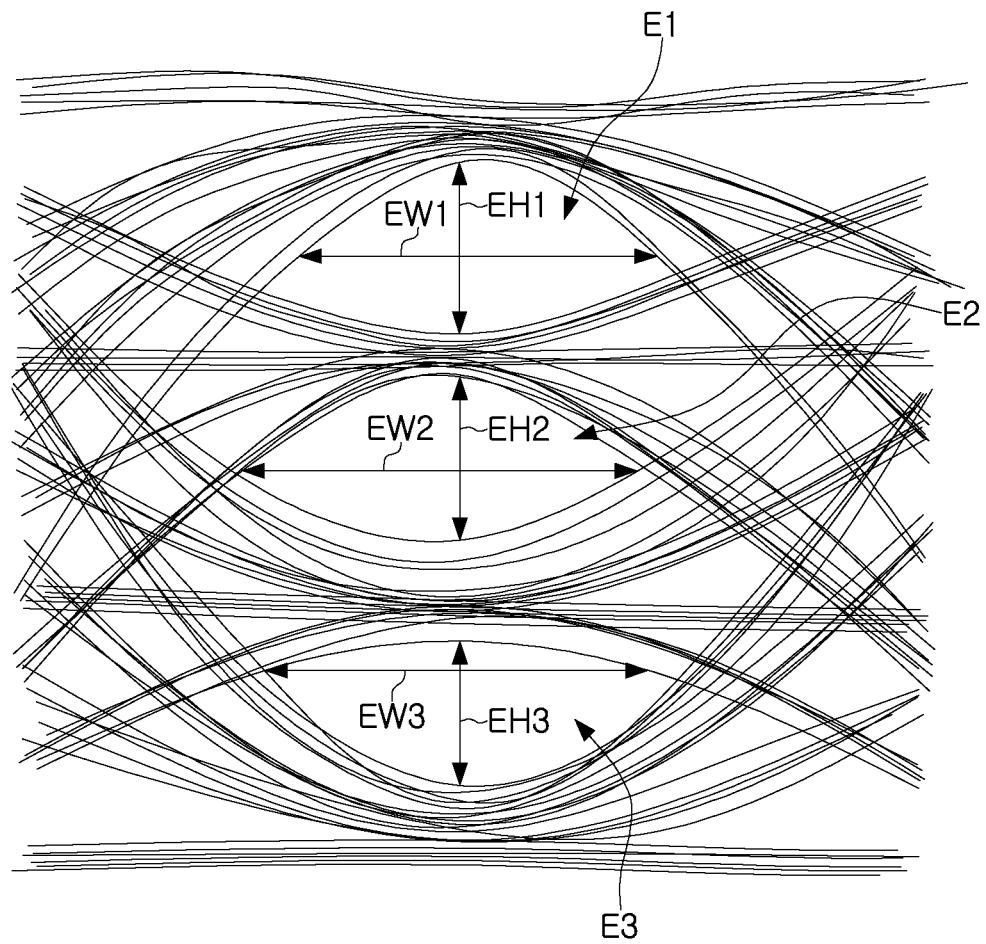
FIG. 8 is a view schematically illustrating an eye diagram formed by accumulating data signals in a storage device according to an embodiment of the present inventive concept.

FIG. 8 is a view schematically illustrating an eye diagram formed by accumulating data signals in a storage device according to an embodiment of the present inventive concept.

In a storage device according to an embodiment of the present inventive concept, a shape of an input output signal may vary according to a signaling method of the signal. Therefore, an eye diagram measured by an EOM circuit may also vary depending on the signaling method of the signal. An amount of EOM information to be stored may vary depending on the measured eye diagram.

For example, the eye diagram illustrated in FIG. 6 may be an eye diagram in a signal transmitted in a non-return-to-zero (NRZ) scheme. In this case, the eye diagram may include an eye, and a state of a memory die to which a data signal is input/output may be determined based on EOM information on the eye.

Referring to FIG. 8, an eye diagram of a signal transmitted using a four-level pulse amplitude modulation (PAM-4) scheme may include three eyes E1, E2, and E3. The input/output signal in the storage device may be transmitted using a signaling method such as PAM-3 or PAM-5. In this case, the measured eye diagram may be different from that illustrated in FIG. 8. For example, the eye diagrams may include three or five eyes.

Each of the three eyes E1, E2, and E3 may include different EOM information. For example, a first eye E1 may have a first eye height EH1 and a first eye width EW1, a second eye E2 may have a second eye height EH2 and a second eye width EW2, and a third eye E3 may have a third eye height EH3 and a third eye width EW3.

A memory controller may store each of the EOM information for the three eyes E1, E2, and E3 in an EOM memory. In this case, a state of a memory die may be determined using some of the stored information.

For example, the memory controller may determine the state of the memory die based on EOM information for at least one eye among a plurality of eyes formed in an eye diagram measured by accumulation of input/output signals of the memory die.

For example, the memory controller may determine the state of the memory die based on EOM information for an eye having a largest size among a plurality of eyes formed in an eye diagram measured by accumulating input/output signals. However, this is merely illustrative and the present inventive concept is not limited thereto. For example, the memory controller may determine the state of the memory die based on EOM information of an eye having a smallest size among the three eyes E1, E2, and E3. In addition, the memory controller may determine the state of the memory die by using an average of the EOM information of each of the three eyes E2, and E3 or a deviation of the EOM information of at least two eyes among the three eyes E1, E2, and E3. In the three eyes E1, E2, and E3 illustrated in FIG. 8, the first eye E1 has a largest size and the third eye E3 has a smallest size, but this is merely illustrative and the present inventive concept is not limited thereto.

Figure 9:
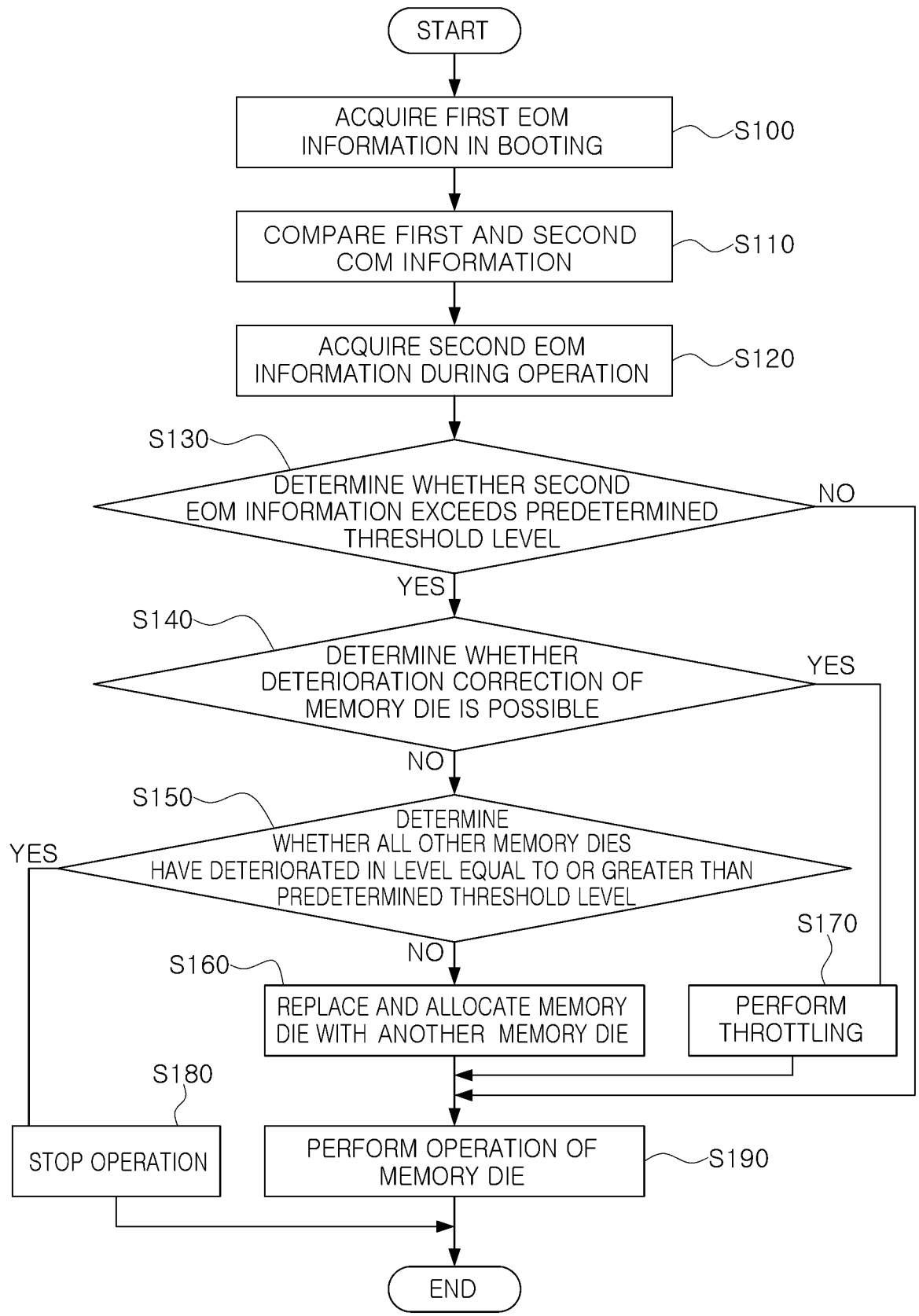
FIG. 9 is a flowchart illustrating a method of controlling a storage device according to an embodiment of the present inventive concept.

FIG. 9 is a flowchart illustrating a method of controlling a storage device according to an embodiment of the present inventive concept.

Referring to FIG. 9, a method of controlling a storage device according to an embodiment of the present inventive concept may include performing a first EOM operation on at least one memory die when a memory controller is booted (S100). In other words, first EOM information may be acquired when the memory controller is booted. The first EOM information acquired by the first EOM operation may be stored in an EOM memory included in the memory controller.

After the first EOM operation is completed, when performing an operation on the at least one memory die, the storage device may perform a second EOM operation by accumulating a signal input to or output from an input/output terminal of the at least one memory die (S110). In other words, second EOM information may be acquired when an operation is being performed on the at least one memory die.

The memory controller may not perform the second EOM operation on all data signals input to or output from the at least one memory die. For example, the memory controller may select a data signal corresponding to an eye diagram having a largest size and/or a smallest size of an eye, among the first EOM information acquired by the first EOM operation. The memory controller may perform the second EOM operation on the selected data signal. For example, with reference to FIG. 8, the memory controller may perform the second EOM operation on the data signal corresponding to the eye diagram of the first eye E1 or the third eye E3.

A storage device according to an embodiment of the present inventive concept may compare the first EOM information stored in the EOM memory and the second EOM information acquired by the second EOM operation (S120), and a state of the memory die in which the EOM operations are performed may be determined, based on a result of the comparison.

In this case, the first EOM information may be reference information corresponding to a normal state of the memory die, and the second EOM information may be real-time information corresponding to a current state of the memory die. For example, the memory controller included in the storage device may determine a state of the memory die only using the first EOM information and the second EOM information. In this case, the memory controller may not use temperature information to determine the state of the memory die.

In a method of controlling a storage device according to an embodiment of the present inventive concept, the memory controller may determine whether the second EOM information exceeds a predetermined threshold level (S130). For example, the predetermined threshold level may correspond to a deterioration level at which a problem may occur when performing certain operations of the memory die such as a read operation, a write operation, an erase operation, or the like.

For example, the memory controller may determine whether the memory die has deteriorated to the extent that there may be a problem in performing an operation. When there is no deterioration problem in the memory die, the memory die may continue to operate (S190).

When the second EOM information exceeds the predetermined threshold level, the memory controller may determine whether deterioration correction of the memory die is possible (S140).

When it is determined that the deterioration correction of the memory die is not possible, it may be determined whether all other memory dies have deteriorated in a level equal to or greater than the predetermined threshold level (S150). When all other memory dies have not deteriorated in a level equal to or greater than the predetermined threshold level, a storage device according to an embodiment of the present inventive concept may replace and allocate an operation load of the memory die with an operation load of another memory die (S160).

When all of the memory dies are degraded in a level equal to or greater than the predetermined threshold level, the memory controller may stop an operation for a certain time period until at least one memory die returns to a normal state without performing an operation requested by the host (S180). In other words, the memory dies may stop operating until at least one of them returns to a normal state.

When the deterioration correction of the corresponding memory die is possible, the memory controller may perform throttling on the memory die (S170). The memory controller may adjust an input voltage value or an operating frequency to stabilize an operating state of the memory die or at least one memory die.

A memory controller included in a storage device according to an embodiment of the present inventive concept may control an operation of a memory die included in the storage device, based on a state of at least one memory die, according to S100 to S190.

Figure 10:
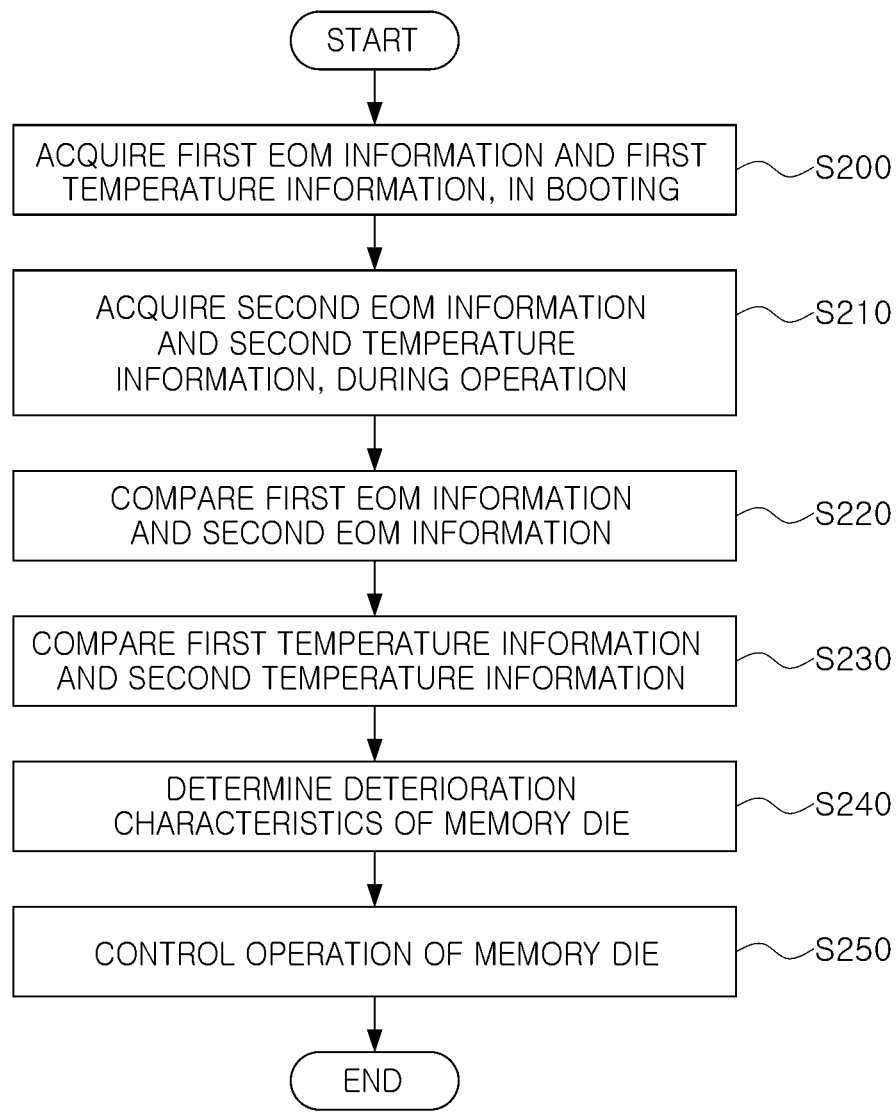
FIG. 10 is a flowchart illustrating a method of controlling a storage device according to another embodiment of the present inventive concept.

FIG. 10 is a flowchart illustrating a method of controlling a storage device according to another embodiment.

Referring to FIG. 10, a method of controlling a storage device according to an embodiment of the present inventive concept may include performing a first EOM operation on at least one memory die to acquire first EOM information, when using a sensor to acquire first temperature information, when a memory controller is booted (S200). The first EOM information and the first temperature information may be stored in an EOM memory included in the memory controller.

After the first EOM operation is completed, when performing an operation on the at least one memory die, the storage device may perform a second EOM operation by accumulating a signal input to or output from an input/output terminal of the at least one memory die, and may acquire second temperature information (S210). In this case, second EOM information and second temperature information may be acquired.

In a storage device according to an embodiment of the present inventive concept, the memory controller may compare the first EOM information and the second EOM information (S220). In addition, the storage device may compare the first temperature information and the second temperature information (S230). For example, the memory controller included in a storage device according to an embodiment of the present inventive concept may determine a deterioration level of the memory die in S220, and more accurately determine a state of the memory die with reference to the temperature information of the memory die in S230.

The memory controller may determine a state of the memory die based on a result of the comparison (S240), and may control an operation of the memory die according to the state of the memory die (S250). In other words, the memory controller may determine deterioration characteristics of the memory die and control an operation of the memory die based on the deterioration characteristics. For example, S240 and S250 may correspond to S130 to S190 of the flowchart illustrated in FIG. 9.

Figure 11:
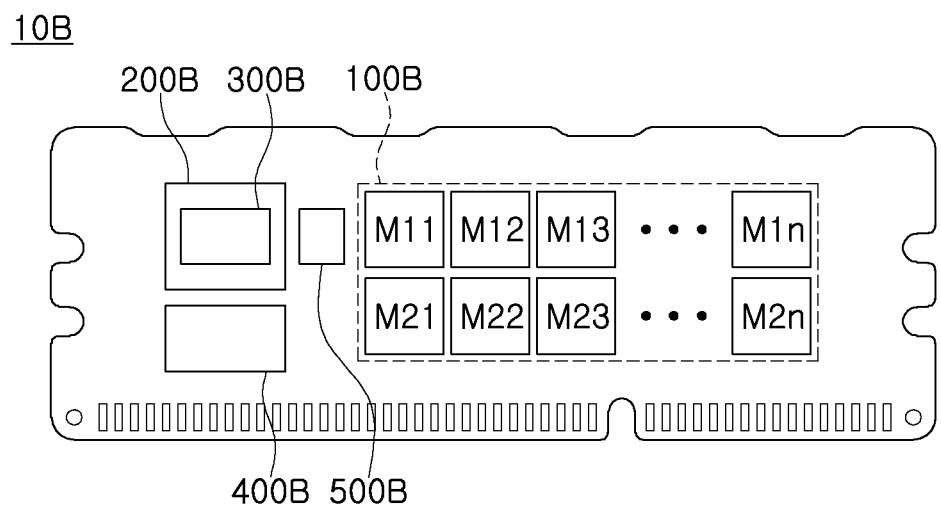
FIGS. 11 and 12 are views schematically illustrating a storage device according to another embodiment of the present inventive concept.
Figure 12:
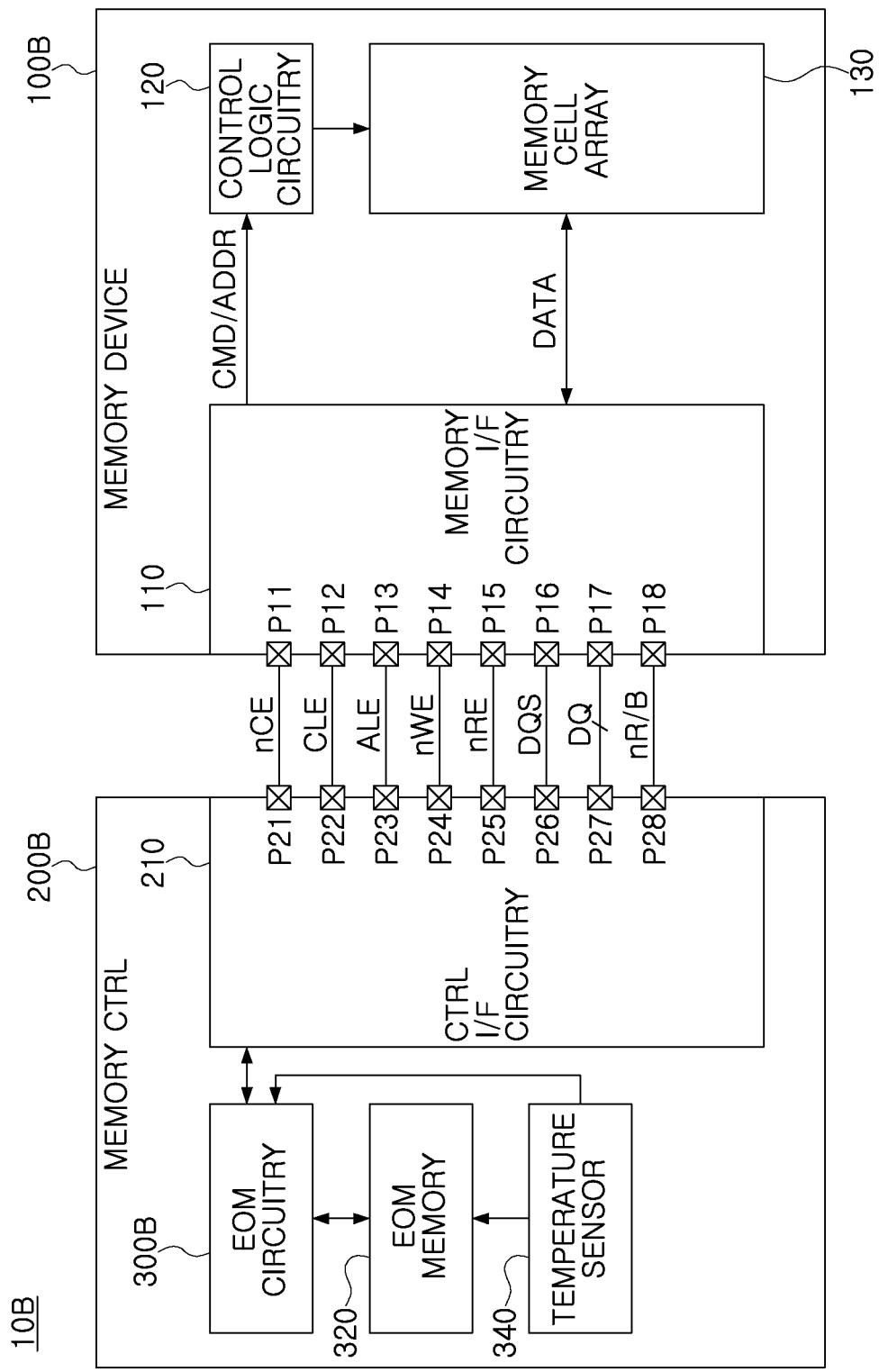

FIGS. 11 and 12 are views schematically illustrating a storage device according to another embodiment of the present inventive concept.

FIGS. 11 and 12 are views schematically illustrating a storage device 10B additionally including temperature sensors 340 and 500B for more accurately determining a state of a memory die. For example, a storage device 10B according to an embodiment of the present inventive concept may be controlled according to S200 to S250 of the flowchart illustrated in FIG. 10.

A storage device 10B according to an embodiment of the present inventive concept may determine a state of a memory die in real time, with reference to measurement results of the temperature sensors 340 and 500B for measuring a surrounding temperature and a result of an EOM operation during an operation of the memory die. For example, the storage device 10B may more accurately determine a deterioration level of the memory die from a temperature of the memory die.

In general, to measure a temperature of a memory die, a temperature sensor corresponding to the memory die may be required. A storage device 10B according to an embodiment of the present inventive concept may use temperature information acquired with at least only a single temperature sensor to more accurately determine a state of a memory die. In addition, even when there is no temperature sensor or a defect occurs in a temperature sensor, die characteristics such as a deterioration level of a memory die or the like may be inferred through EOM information.

Referring to FIG. 11, a storage device 10B according to an embodiment of the present inventive concept may correspond to the storage device 10A illustrated in FIG. 1. For example, the storage device 10B may include a non-volatile memory device 100B, a memory controller 200B including an EOM circuit 300B, and a buffer memory 400B.

Unlike the storage device 10A illustrated in FIG. 1, the storage device 10B may further include a temperature sensor 500B disposed as a separate component from the non-volatile memory device 100B and the memory controller 200B. The temperature sensor 500B may be configured to acquire temperature information of at least one memory die M11 to M1*n* or M21 to M2*n* included in the non-volatile memory device 100B.

Referring to FIG. 12, a storage device 10B according to an embodiment of the present inventive concept may correspond to the storage device 10A illustrated in FIG. 3A. For example, the storage device 10B may include a non-volatile memory device 100B and a memory controller 200B. The non-volatile memory device 100B may include a memory interface circuit 110, a control logic circuit 120, and a memory cell array 130. The memory controller 200B may include a controller interface circuit 210, an EOM circuit 300B, and an EOM memory 320.

Unlike the storage device 10A illustrated in FIG. 3A, the storage device 10B may further include a temperature sensor 340 implemented as a circuit inside the memory controller 200B. The temperature sensor 340 may be configured to acquire temperature information of at least one memory die included in the non-volatile memory device 100B.

Figure 13:
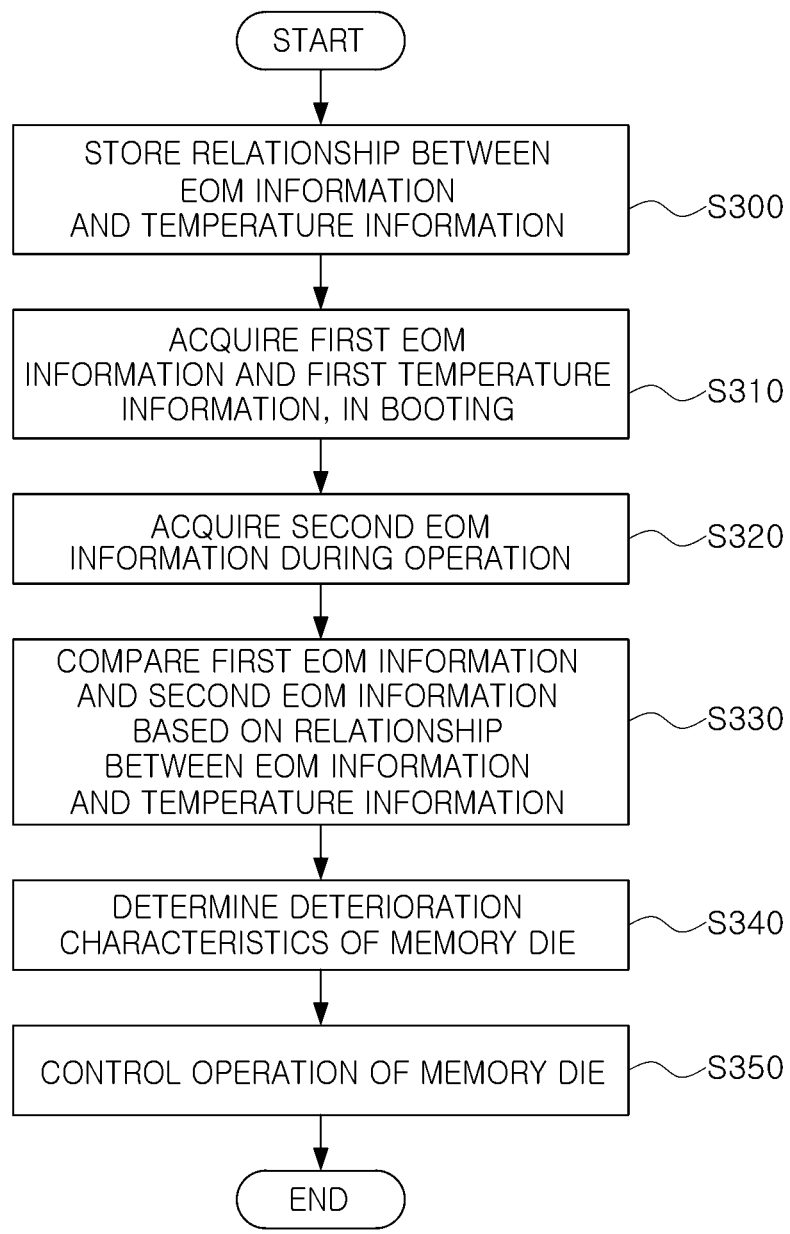
FIG. 13 is a flowchart illustrating a method of controlling a storage device according to another embodiment of the present inventive concept.
Figure 14:
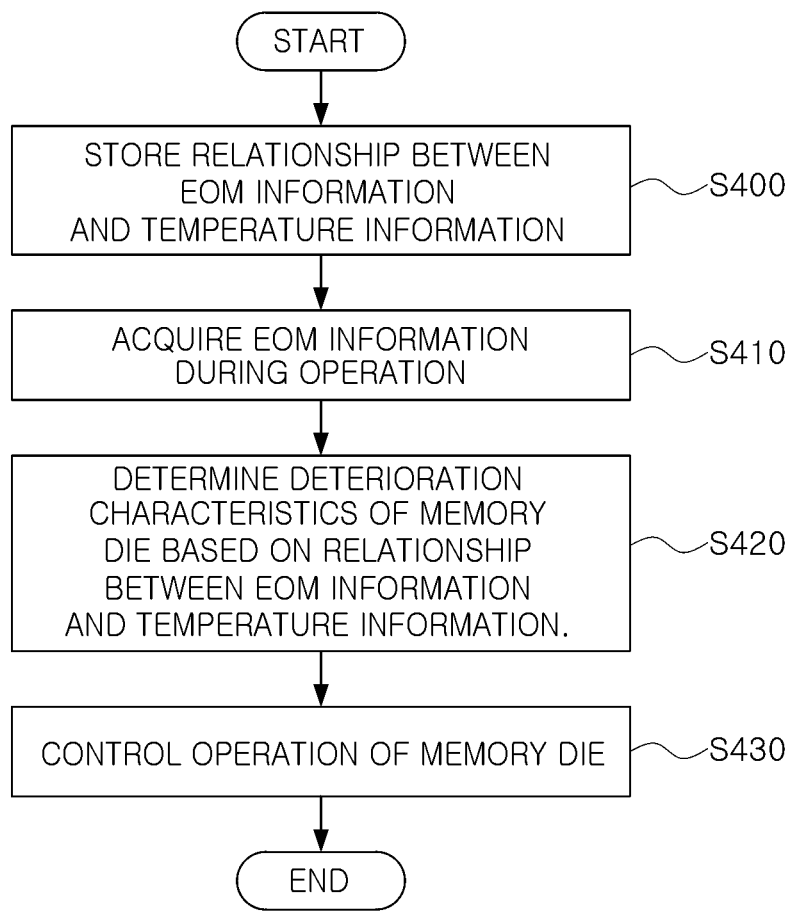
FIG. 14 is a flowchart illustrating a method of controlling a storage device according to another embodiment of the present inventive concept.

FIG. 13 is a flowchart illustrating a method of controlling a storage device according to another embodiment of the present inventive concept. FIG. 14 is a flowchart illustrating a method of controlling a storage device according to another embodiment of the present inventive concept.

The storing of the temperature information included in the method of controlling the storage device 10B, described in FIG. 10, may be only an auxiliary means for determining a state of the memory die, and may be omitted. For example, as temperature information of a memory die, only first temperature information at the time of booting may be stored, and may not be separately stored during an operation. In other words, temperature data may not be acquired again during an operation of the memory die. However, the present inventive concept is not limited thereto.

Referring to FIG. 13, a storage device according to an embodiment of the present inventive concept may store a relationship between EOM information and temperature information in advance (S300). For example, an eye diagram according to a change in temperature may be stored in advance in storage spaces such as an eFuse or a one time programmable (OTP) memory in manufacturing a memory die.

A storage device according to an embodiment of the present inventive concept may determine a state of the memory die in real time, based on the relationship between the EOM information and the temperature information, stored in advance.

For example, in a similar manner to S200 and S210 illustrated in FIG. 10, the storage device may acquire first EOM information and first temperature information when a memory controller is booted (S310), and may acquire second EOM information during an operation of the memory die (S320). In S320, second temperature information may not be acquired, but the present inventive concept is not limited thereto.

A storage device according to an embodiment of the present inventive concept may compare the first EOM information and the second EOM information based on the relationship between the EOM information and the temperature information in at least one memory die (S330).

The memory controller included in a storage device according to an embodiment of the present inventive concept may determine a deterioration level of the memory die by comparing the first EOM information and the second EOM information (S340). In other words, the memory controller may determine the deterioration characteristics of the memory die in S340. The memory controller may control the operation of the memory die according to the state of the memory die (S350). For example, S340 and S350 may correspond to S130 to S190 of the flowchart illustrated in FIG. 9.

Referring to FIG. 14, S400 to S430 may correspond to S300 to S350 illustrated in FIG. 13. Temperature information of a memory die may be stored only during an operation, and may not be separately stored in booting. For example, the S310 illustrated in FIG. 13 may be omitted.

For example, a storage device according to an embodiment of the present inventive concept may store a relationship between EOM information and temperature information in advance in manufacturing at least one memory die (S400), and may acquire the EOM information during an operation of the memory die (S410).

A memory controller may determine a state of the memory die from the EOM information acquired from the memory die, based on the relationship between the EOM information and the temperature information, stored in advance (S420). The memory controller may control the operation of the memory die according to the state of the memory die (S430). For example, S430 may correspond to S130 to S190 of the flowchart illustrated in FIG. 9.

According to the method of controlling the storage device illustrated in FIG. 14, a current state of the memory die may be determined only by real-time EOM information, without using initial EOM information stored when the memory controller is booted. According to the method of controlling the storage device illustrated in FIG. 13, a current state of the memory die may be more accurately determined by using initial EOM information stored when the memory controller is booted.

Figure 15:
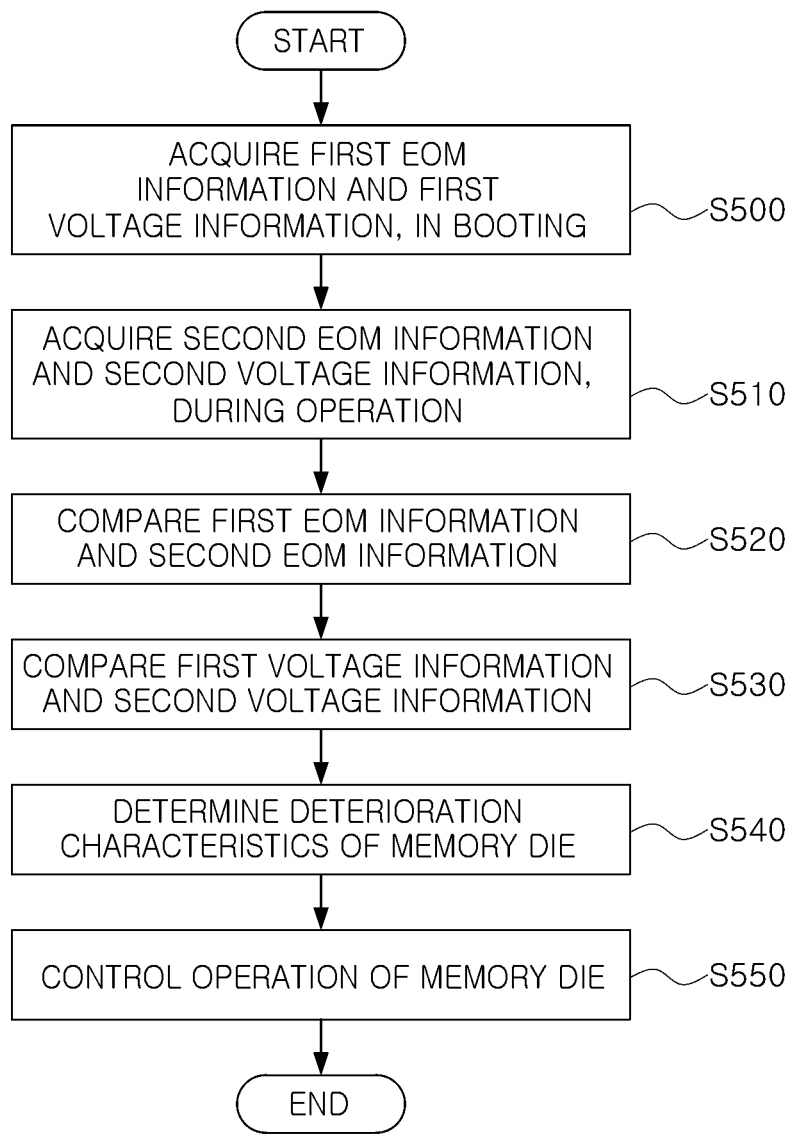
FIG. 15 is a flowchart illustrating a method of controlling a storage device according to another embodiment of the present inventive concept.

FIG. 15 is a flowchart illustrating a method of controlling a storage device according to another embodiment.

Referring to FIG. 15, S500 to S550 may correspond to S200 to S250 illustrated in FIG. 10, respectively. According to a method of controlling a storage device, as illustrated in FIG. 15, a memory controller may control an operation of a memory die included in the storage device by using voltage information corresponding to a voltage value measured by the memory die, instead of temperature information.

For example, the memory controller may acquire first voltage information of at least one memory die, together with first EOM information, when performing a first EOM operation (e.g., in booting) (S500). When a second EOM operation is performed (e.g., when the memory die is operated), the memory controller may acquire second voltage information of the at least one memory die, together with second EOM information (S510). In other words, the memory controller may acquire second EOM information and second voltage information when the memory die is operated.

In a storage device according to an embodiment of the present inventive concept, the memory controller may compare the first EOM information and the second EOM information (S520), and compare the first voltage information and the second voltage information (S530). For example, the memory controller included in a storage device according to an embodiment of the present inventive concept may determine a deterioration level of the memory die in S520, and may more accurately determine a state of the memory die with reference to the voltage information of the memory die in S530.

The memory controller may determine a state of the memory die based on a result of the comparison (S540), and may control an operation of the memory die according to the state of the memory die (S550). For example, S540 and S550 may correspond to S130 to S190 of the flowchart illustrated in FIG. 9.

When the voltage information is used, and the second voltage information is more stable than the first voltage information, the storage device may reduce an input voltage value for the memory die or reduce an operating frequency, to reduce power consumption.

Similarly to the temperature information, the acquiring and storing of the voltage information may only be an auxiliary means for determining a state of the memory die, and may be omitted. For example, as voltage information of a memory die, only first voltage information at the time of booting may be stored, and the second voltage information may not be separately stored during an operation of the memory die. A voltage level of the memory die may be stored only during an operation, and may not be separately stored in booting.

Figure 16:
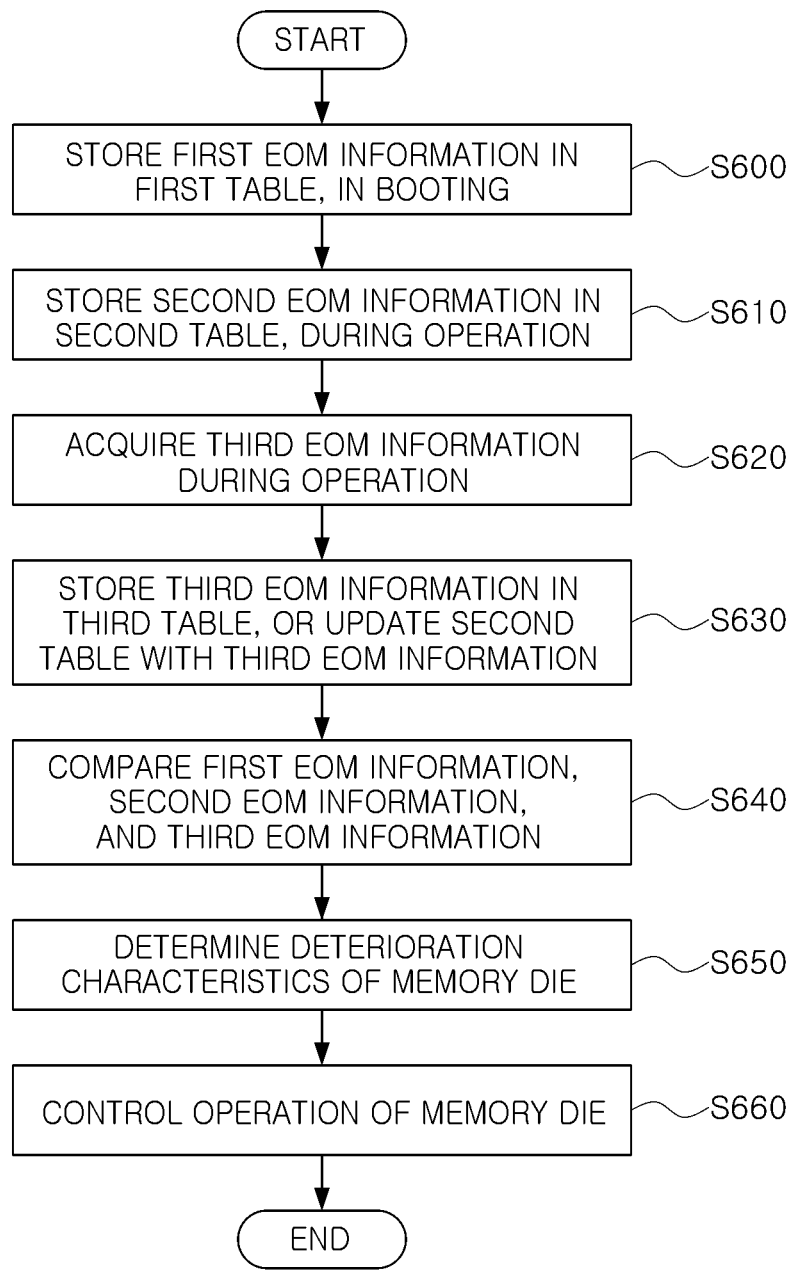
FIG. 16 is a flowchart illustrating a method of controlling a storage device according to another embodiment of the present inventive concept.
Figure 17:
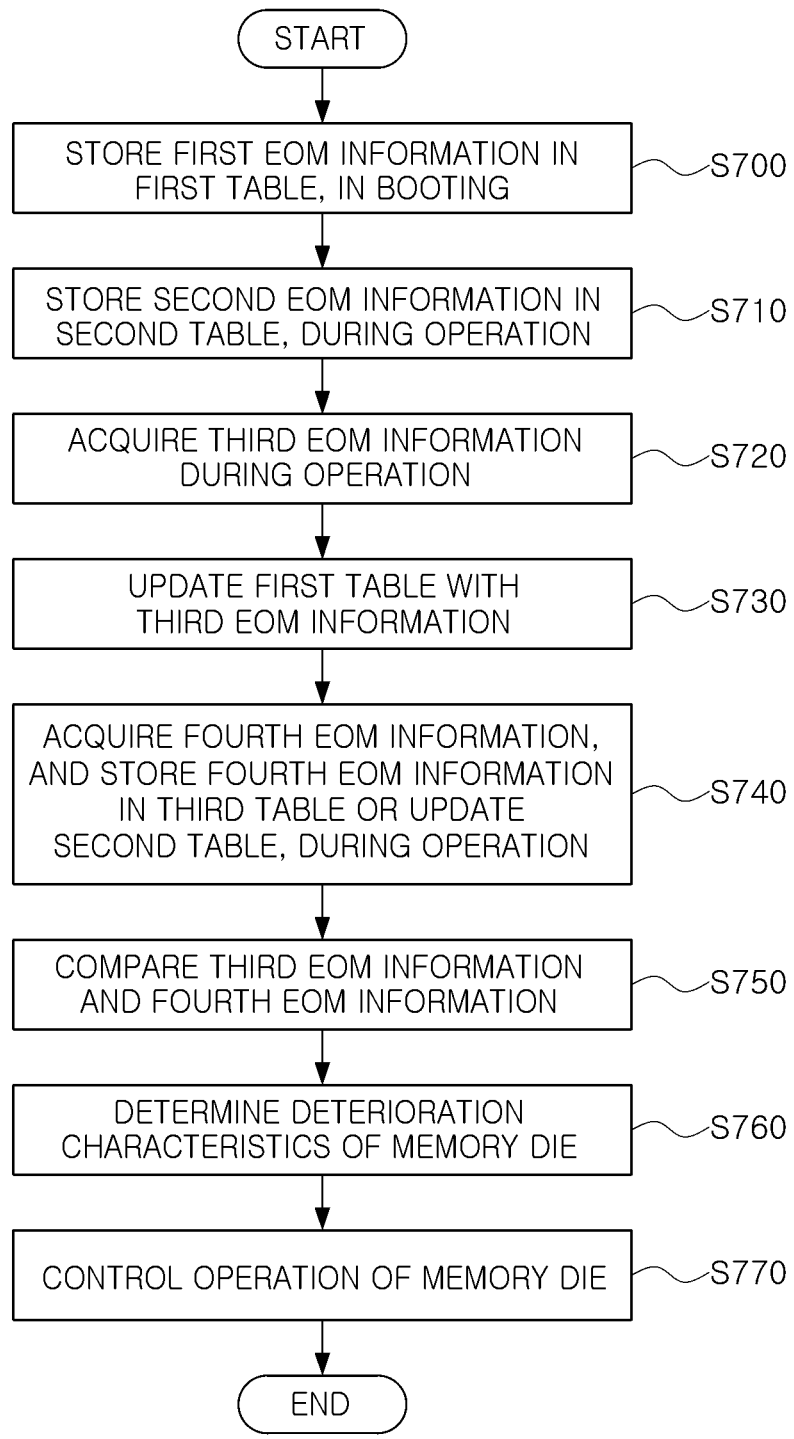
FIG. 17 is a flowchart illustrating a method of controlling a storage device according to another embodiment of the present inventive concept.

FIG. 16 is a flowchart illustrating a method of controlling a storage device according to another embodiment of the present inventive concept. FIG. 17 is a flowchart illustrating a method of controlling a storage device according to another embodiment of the present inventive concept.

FIGS. 16 and 17 are view illustrating a method of updating previously acquired EOM information using EOM information acquired by a plurality of EOM operations. For example, FIG. 16 may be a case in which a state of a memory die in which an operation is in progress is checked a plurality of times. FIG. 17 may be a case in which reference EOM information for determining a state of a memory die is updated.

Referring to FIG. 16, when a first EOM operation is performed (e.g., in booting), a memory controller may acquire first EOM information in a form of a table and may store the first EOM information in a first table of an EOM memory (S600). When a second EOM operation is performed (e.g., when a memory die is operated), the memory controller may acquire a second EOM information in a form of a table and may store the second EOM information in a second table of the EOM memory (S610). For example, the first table may be a table in which reference EOM information is stored, and the second table may be a table in which real-time EOM information is stored.

After completing the second EOM operation, the memory controller may accumulate a signal input to or output from an input/output terminal of the memory die, during an operation of the memory die, to perform a third EOM operation and acquire third EOM information (S620). The third EOM information may be stored in a third table of the EOM memory or updated in the second table in which the second EOM information is stored (S630).

In a storage device according to an embodiment of the present inventive concept, when the third EOM information is stored in the third table, the memory controller may compare the first EOM information, the second EOM information, and the third EOM information (S640). When the third EOM information is updated in the second table, the memory controller may compare the first EOM information and the third EOM information. In this case, the memory controller may compare the contents of the first table to the contents of the second table updated with the third EOM information.

For example, the memory controller included in a storage device according to an embodiment of the present inventive concept may determine a deterioration level of the memory die, based on a comparison result of the reference EOM information and the real-time EOM information (S650), and may control art operation of the memory die according to a state of the memory die (S660). For example, S650 and S660 may correspond to S130 to S190 of the flowchart illustrated in FIG. 9.

The reference EOM information of the memory die may be acquired at an initial time, when the memory controller is booted. To acquire new reference EOM information during an operation of the memory die, the memory controller may stop a normal operation of the memory die, may perform characteristic correction of a data signal input to or output from the memory die, and may then perform an additional EOM operation to update initial EOM information.

Referring to FIG. 17, S700 and S710 may correspond to S600 and S610 illustrated in FIG. 16. After acquiring second EOM information, in other words, after S710, a memory controller included in a storage device according to an embodiment of the present inventive concept may suspend a normal operation of a memory die and may correct characteristics of data signals input to or output from the memory die. The memory controller may acquire third EOM information corresponding to new reference EOM information by performing a third EOM operation (S720).

The memory controller may update the third EOM information into a first table in which first EOM information is stored (S730). The memory controller may update the reference EOM information by stopping the normal operation and receiving a frequency of an external oscillator to output the same as a data signal.

After completing the third EOM operation, the memory controller may accumulate a signal input to or output from an input/output terminal of the memory die during an operation of the memory die, to perform a fourth EOM operation to acquire fourth EOM information. The fourth EOM information may be stored in a third table of the EOM memory, or updated in a second table in which the second EOM information is stored (S740).

In a storage device according to an embodiment of the present inventive concept, when the fourth EOM information is stored in the third table, the memory controller may compare the second EOM information, the third EOM information, and the fourth EOM information. When the fourth EOM information is updated in the second table, the memory controller may compare the third EOM information and the fourth EOM information.

For example, the memory controller included in a storage device according to an embodiment of the present inventive concept may determine a deterioration level of the memory die based on a comparison result of the reference EOM information and the real-time EOM information (S760), and may control an operation of the memory die according to a state of the memory die (S770). For example, S760 and S770 may correspond to S130 to S190 of the flowchart illustrated in FIG. 9.

A method of controlling a storage device according to the flowcharts illustrated in FIGS. 9, 10, and 13 to 17 is not limited to the methods illustrated. For example, in a storage device according to an embodiment of the present inventive concept, some of the operations illustrated in the drawings may be omitted or a new operation may be performed to determine a deterioration state of at least one memory die and control the memory die based on the determined deterioration state.

A storage device according to an embodiment of the present inventive concept may use an EOM circuit performing an EOM operation respectively when booting the memory controller and performs an operation on a memory die, to determine a deterioration level of the memory die in real time.

A storage device according to an embodiment of the present inventive concept may use at least a temperature sensor and/or measure a voltage state to more accurately determine a deterioration level of a memory die.

While example embodiments of the present inventive concept have been illustrated a described above, it will be apparent to those skilled in the art that modifications and variations could be made thereto without departing from the scope of the present inventive concept as set forth by the appended claims.

What is claimed is:

1. A storage device, comprising:
a non-volatile memory device including at least one memory die inputting and outputting a first data signal and a second data signal; and a memory controller including an eye open monitoring (BOM) circuit configured to perform a first EOM operation of generating first EOM information based on the first data signal and a second EOM operation of generating second EOM information based on of the second data signal of at least one of the regions, and configured to compare the second EOM information with the first EOM information, wherein the memory controller acquires first voltage information of the at least one memory die when performing the first EOM operation, acquires second voltage information of the at least one memory die when performing the second EOM operation, compares the first voltage information with the second voltage information, and controls the at least one memory die based on the comparison of the first EOM information with the second EOM information and the comparison of the first voltage information with the second voltage information.

2. The storage device of claim 1, wherein the EOM circuit performs the first EOM operation when the memory controller is booted, and stores the first EOM information acquired by the first EOM operation, in an EOM memory included in the memory controller.

3. The storage device of claim 2, wherein the EOM circuit performs the second EOM operation when performing an operation on the at least one memory die after the first EOM operation is completed.

4. The storage device of claim 1, further comprising:
a temperature sensor configured to acquire first temperature information of the at least one memory die when performing the first EOM operation, and acquire second temperature information of the at least one memory die when performing the second EOM operation, and
the memory controller controls the at least one memory die, based on the result of the comparison of the first EOM information and the second EOM information and a result of the comparison of the first temperature information and the second temperature information.

5. The storage device of claim 1, wherein the memory controller is configured to transmit a third data signal, different from the first data signal and the second data signal, to the plurality of memory regions, or receive the third data signal from the plurality of memory regions, based on the first EOM information and the second EOM information.

6. The storage device of claim 1, wherein the memory controller performs throttling on the at least one memory die, based on the result of the comparison of the first EOM information and the second EOM information.

7. The storage device of claim 1, wherein the at least one memory die includes a first memory die and a second memory die, and
the memory controller replaces and allocates an operation load of the first memory die with an operation load of the second memory die, and performs a corresponding operation in the second memory die.

8. The storage device of claim 1, wherein the memory controller further comprises an additional EOM circuit, different from the EOM circuit,
wherein the additional EOM circuit performs an operation to compensate for distortion of a signal applied from a host transmitting or receiving a packet to or from the memory controller.

9. The storage device of claim 1, wherein the memory controller further comprises an additional EOM circuit, different from the EOM circuit, wherein the additional EOM circuit performs an EOM operation, based on a pattern of a data signal input to or output from a buffer memory storing data processed by the memory controller,
wherein the memory controller controls the buffer memory, based on EOM information generated from the additional EOM circuit.

10. A storage device, comprising:
a non-volatile memory device including at least one memory die, the at least one memory die includes a memory cell array including a plurality of memory regions, a memory interface circuit for providing signals to control the plurality of memory regions through first control pins, and a control logic circuit for controlling the plurality of memory regions based on the signals; and
a memory controller including a controller interface circuit for providing the signals to the first control pins through second control pins, an eye open monitoring (BOM) circuit for accumulating a data signal input to or output from the at least one memory die, among the signals, to perform at least one EOM operation, and an EOM memory storing EOM information acquired by the at least one EOM operation,
wherein the memory controller is configured to acquire voltage information of the at least one memory die while performing the at least one EOM operation and control the at least one memory die, based on the EOM information stored in the EOM memory and the voltage information.

11. The storage device of claim 10, wherein the memory controller further comprises a host interface circuit receiving an external signal from a host.

12. The storage device of claim 11, wherein the memory controller further comprises an additional EOM circuit, different from the EOM circuit,
wherein the additional EOM circuit performs an operation to compensate for distortion of the external signal transmitted from the host to the host interface circuit.

13. The storage device of claim 10, wherein the EOM information comprises a rising time or a falling time of an eye, jitter, an eye height, or an eye width.

14. The storage device of claim 10, wherein the EOM information varies according to a signaling method of the data signal, and the memory controller is configured to determine a state of the at least one memory die, based on the EOM information on at least one eye, among a plurality of eyes formed in the accumulated data signal.

15. The storage device of claim 14, wherein the memory controller is configured to determine a state of the at least one memory die, based on the EOM information on an eye having a largest size, among the plurality of eyes formed in the accumulated data signal.

16. The storage device of claim 10, wherein the at least one memory die comprises a first memory die and a second memory die, and
the memory controller is configured to adjust a first operation load of the first memory die and a second operation load of the second memory die, based on a state of the first memory die and a state of the second memory die, respectively.

17. The storage device of claim 16, wherein the first operation load decreases and the second operation load increases, when a degree of deterioration of the first memory die is higher than a degree of deterioration of the second memory die.

18. The storage device of claim 10, further comprising a temperature sensor configured to acquire temperature information of the at least one memory die.

19. A method of controlling a storage device, comprising:
- performing a first eye open monitoring (EOM) operation on at least one memory die and acquiring first voltage information of the at least one memory die when performing the first EOM operation;
- performing a second EOM operation by accumulating a signal input to or output from an input/output terminal of the at least one memory die when an operation on the at least one memory die is performed and acquiring second voltage information of the at least one memory die when performing the second EOM operation:
- comparing the first EOM information with second EOM information acquired by the second EOM operation;
- comparing the first voltage information with the second voltage information; and
- determining a state of the at least one memory die, based on the comparison of the first BOM information with the second EOM information and the comparison of the first voltage information with the second voltage information.

\* \* \* \* \*